United States Patent
Lee et al.

(10) Patent No.: US 10,205,020 B2
(45) Date of Patent: Feb. 12, 2019

(54) SEMICONDUCTOR DEVICE

(71) Applicant: Samsung Electronics Co., Ltd., Suwon-si (KR)

(72) Inventors: Yongseok Lee, Hwaseong-si (KR); Jeongyun Lee, Yongin-si (KR); Gigwan Park, Hwaseong-si (KR); Keo Myoung Shin, Seoul (KR); Hyunji Kim, Suwon-si (KR); Sangduk Park, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 91 days.

(21) Appl. No.: 15/348,586

(22) Filed: Nov. 10, 2016

(65) Prior Publication Data

US 2017/0148914 A1    May 25, 2017

(30) Foreign Application Priority Data

Nov. 25, 2015    (KR) .................. 10-2015-0165687

(51) Int. Cl.
| | |
|---|---|
| H01L 29/78 | (2006.01) |
| H01L 29/66 | (2006.01) |
| H01L 27/092 | (2006.01) |
| H01L 29/06 | (2006.01) |
| H01L 29/423 | (2006.01) |

(Continued)

(52) U.S. Cl.
CPC .. *H01L 29/7843* (2013.01); *H01L 21/823814* (2013.01); *H01L 21/823821* (2013.01); *H01L 27/092* (2013.01); *H01L 27/0924* (2013.01); *H01L 28/00* (2013.01); *H01L 29/0649* (2013.01); *H01L 29/42372* (2013.01); *H01L 29/6656* (2013.01); *H01L 29/66545* (2013.01);
(Continued)

(58) Field of Classification Search
CPC ....... H01L 2924/00; H01L 2924/15311; H01L 2224/94; H01L 2224/81815; H01L 24/81; H01L 2224/0401; H01L 21/563
See application file for complete search history.

(56) References Cited

U.S. PATENT DOCUMENTS

| | | |
|---|---|---|
| 8,431,466 B2 | 4/2013 | Lin et al. |
| 8,697,501 B1 | 4/2014 | Choi et al. |

(Continued)

FOREIGN PATENT DOCUMENTS

KR    10-2014-0112363    9/2014

*Primary Examiner* — Marc Armand
*Assistant Examiner* — Quinton Brasfield
(74) *Attorney, Agent, or Firm* — Muir Patent Law, PLLC

(57) ABSTRACT

A semiconductor device includes an active pattern having sidewalls defined by a device isolation pattern disposed on a substrate and an upper portion protruding from a top surface of the device isolation pattern, a liner insulating layer on the sidewalls of the active pattern, a gate structure on the active pattern, and source/drain regions at both sides of the gate structure. The liner insulating layer includes a first liner insulating layer and a second liner insulating layer having a top surface higher than a top surface of the first liner insulating layer. Each of the source/drain regions includes a first portion defined by the second liner insulating layer, and a second portion protruding upward from the second liner insulating layer and covering the top surface of the first liner insulating layer.

19 Claims, 26 Drawing Sheets

(51) Int. Cl.
  *H01L 21/8238* (2006.01)
  *H01L 49/02* (2006.01)
  H01L 29/165 (2006.01)

(52) U.S. Cl.
  CPC ........ *H01L 29/7848* (2013.01); *H01L 29/165* (2013.01)

(56) References Cited

U.S. PATENT DOCUMENTS

| | | |
|---|---|---|
| 8,946,829 B2 | 2/2015 | Wann et al. |
| 8,993,384 B2 | 3/2015 | Hung et al. |
| 9,029,226 B2 | 5/2015 | Tsai et al. |
| 9,029,930 B2 | 5/2015 | Kelly et al. |
| 9,064,864 B1 | 6/2015 | Stessin |
| 9,076,869 B1 | 7/2015 | Hu et al. |
| 9,087,900 B1 | 7/2015 | Kim |
| 9,105,654 B2 | 8/2015 | Ma et al. |
| 9,184,087 B2 | 11/2015 | Chiang et al. |
| 9,281,196 B2 | 3/2016 | Wang et al. |
| 2015/0091059 A1* | 4/2015 | Hung ................ H01L 29/66795 257/192 |
| 2015/0187913 A1 | 7/2015 | Peake et al. |
| 2017/0005002 A1* | 1/2017 | Ching ............. H01L 21/823412 |

* cited by examiner

SEMICONDUCTOR DEVICE

CROSS-REFERENCE TO RELATED APPLICATION

This U.S. non-provisional patent application claims priority under 35 U.S.C. § 119 to Korean Patent Application No. 10-2015-0165687, filed on Nov. 25, 2015, in the Korean Intellectual Property Office, the disclosure of which is hereby incorporated by reference in its entirety.

BACKGROUND

The exemplary implementations relate to a semiconductor device and, more particularly, to a semiconductor device including a field effect transistor.

Semiconductor devices are widely used in the eletronics industry because of their small sizes, multi-functional characteristics, and low manufacturing costs. Semiconductor devices may be categorized as any one of semiconductor memory devices storing logical data, semiconductor logic devices processing logic data, and hybrid semiconductor devices having both the function of the semiconductor memory devices and the function of the semiconductor logic devices. Semiconductor devices with excellent characteristics have been increasingly demanded with the development of the electronics industry. For example, high-reliable, high-speed, and/or multi-functional semiconductor devices have been increasingly demanded. To satisfy these demands, semiconductor devices have been highly integrated and structures of semiconductor devices have become more and more complicated.

SUMMARY

Exemplary implementations of the herein described subject matter may provide a semiconductor device including a field effect transistor with improved electrical characteristics.

In one aspect, a semiconductor device may include an active pattern having sidewalls defined by a device isolation pattern on a substrate and having an upper portion protruding from a top surface of the device isolation pattern, a liner insulating layer on the sidewalls of the active pattern, a gate structure on the active pattern, and source/drain regions at both sides of the gate structure. The liner insulating layer may include a first liner insulating layer and a second liner insulating layer having a top surface higher than a top surface of the first liner insulating layer. Each of the source/drain regions may include a first portion defined by the second liner insulating layer, and a second portion protruding upward from the second liner insulating layer and covering the top surface of the first liner insulating layer.

In another aspect, a semiconductor device may include an active pattern having sidewalls defined by a device isolation pattern on a substrate and having an upper portion protruding from a top surface of the device isolation pattern, a liner insulating layer extending between the active pattern and the device isolation pattern, a gate structure on the active pattern, and source/drain regions at both sides of the gate structure. At least a portion of the liner insulating layer may protrude from the top surface of the device isolation pattern to define a lower portion of each of the source/drain regions.

In yet another aspect, a semiconductor device may include an active pattern protruding from a substrate, a gate structure intersecting the active pattern, and source/drain regions at both sides of the gate structure. The active pattern may include a first portion overlapping with the gate structure, and second portions overlapping with the source/drain regions. Top surfaces of the second portions of the active pattern may be lower than a top surface of the first portion of the active pattern. The second portions of the active pattern may be inserted in lower portions of the source/drain regions, respectively.

In one aspect, a semiconductor device having an active pattern having sidewalls is defined by a device isolation pattern on a substrate. The active pattern has an upper portion protruding from a top surface of the device isolation pattern and a lower portion contacting the substrate. The device further includes a liner insulating layer on the sidewalls of the active pattern, a gate structure intersecting the active pattern, and source/drain regions at both sides of the gate structure. The horizontal growth width of the lower portions of the source/drain regions are constrained by the liner insulating layer, and the horizontal growth width and vertical growth length of the upper portions of the source/drain regions are not constrained above the topmost portion of the liner insulating layer.

BRIEF DESCRIPTION OF THE DRAWINGS

The exemplary implementations will become more apparent in view of the attached drawings and accompanying detailed description.

DETAILED DESCRIPTION OF THE EMBODIMENTS

Figure 1:
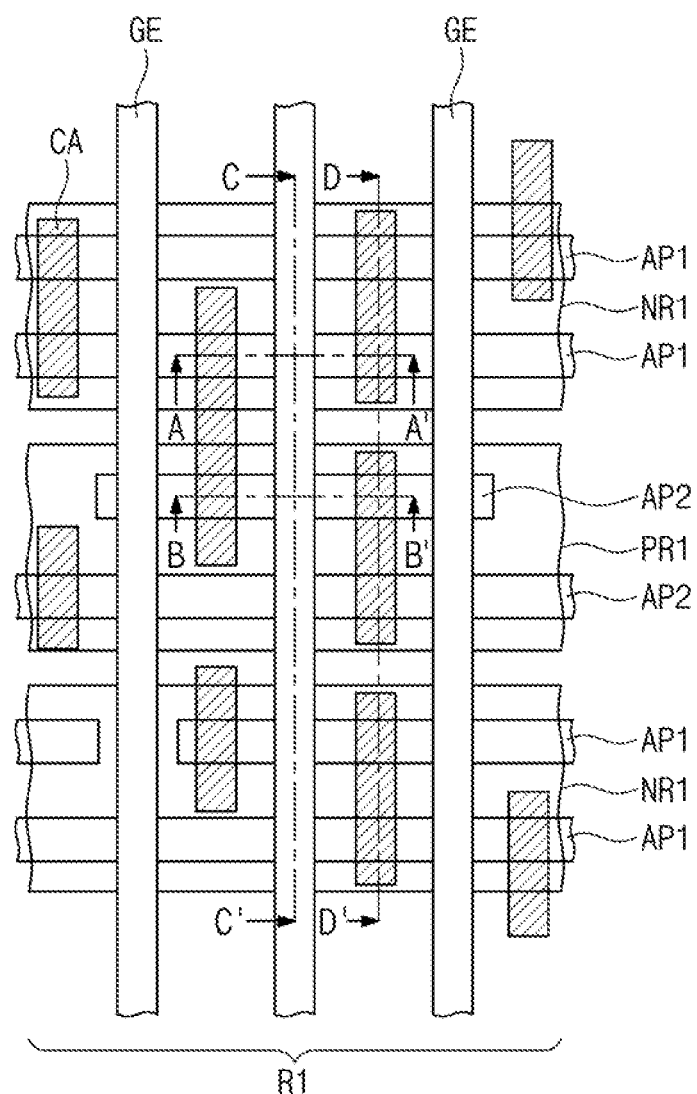
FIG. 1 is a plan view illustrating a semiconductor device according to some exemplary implementations.
Figure 1:
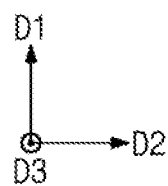

The present disclosure now will be described more fully hereinafter with reference to the accompanying drawings, in which various exemplary implementations are shown. The invention may, however, be embodied in many different forms and should not be construed as limited to the example exemplary implementations set forth herein. These example exemplary implementations are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary exemplary implementations, these figures are not necessarily intended to be mutually exclusive from each other. Rather, as will be seen from the context of the detailed description below, certain features depicted and described in different figures can be combined with other features from other figures to result in various exemplary implementations, when taking the figures and their description as a whole into consideration.

Although the figures described herein may be referred to using language such as "one exemplary implementations," or "certain exemplary implementations," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary exemplary implementation.

The terminology used herein is for the purpose of describing particular exemplary implementations only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 2A:
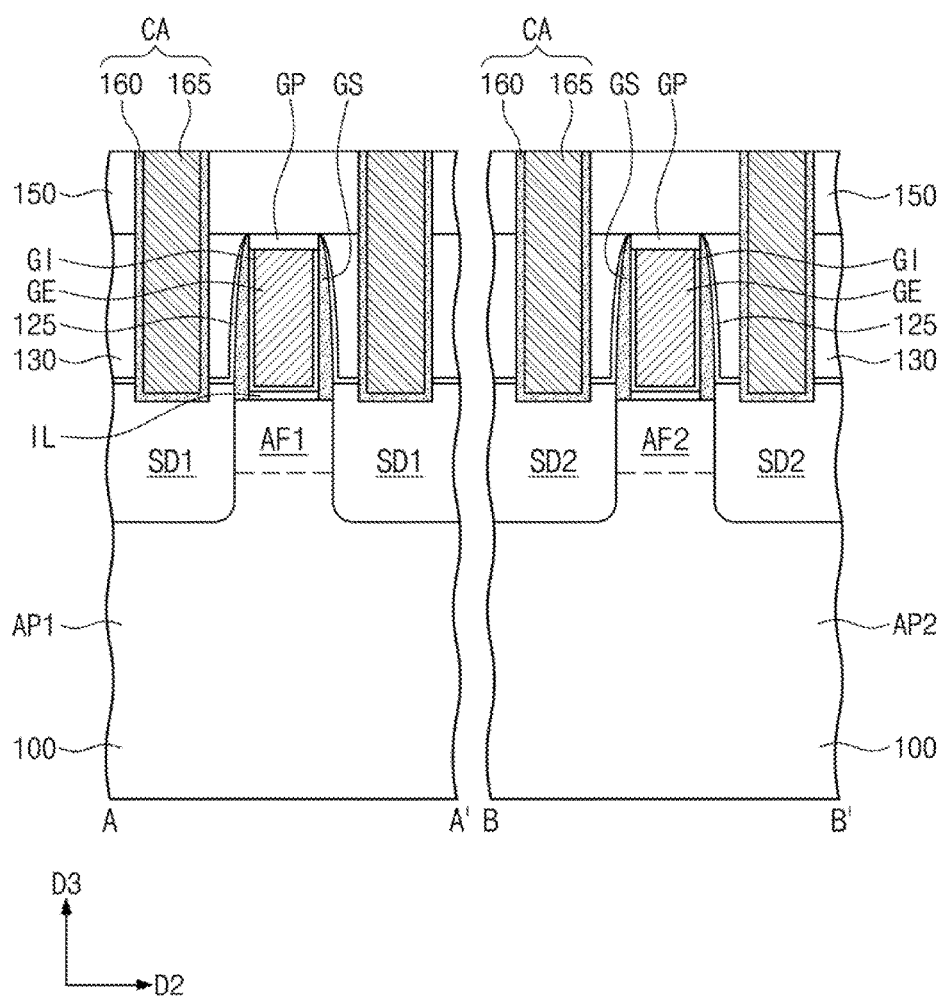
FIG. 2A is a cross-sectional view taken along lines A-A' and B-B' of FIG. 1, and FIGS. 2B and 2C are cross-sectional views taken along lines C-C' and D-D' of FIG. 1, respectively.
Figure 2B:
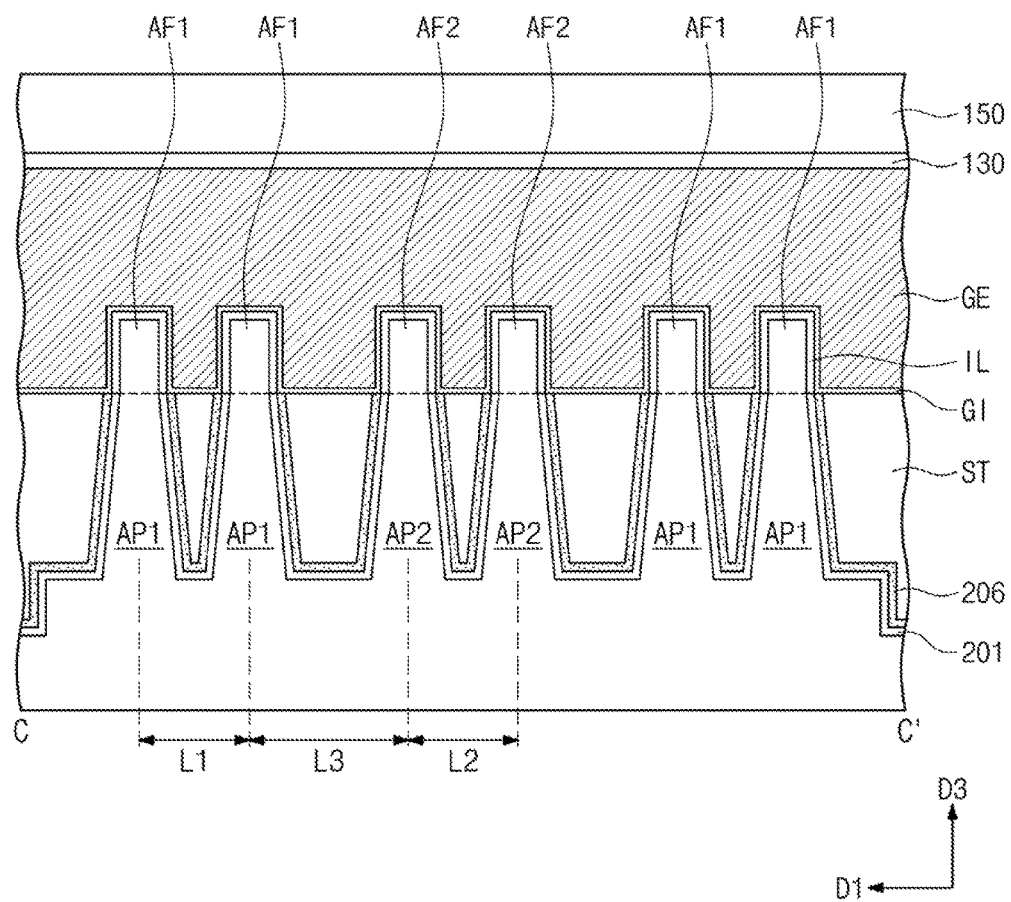
Figure 2C:
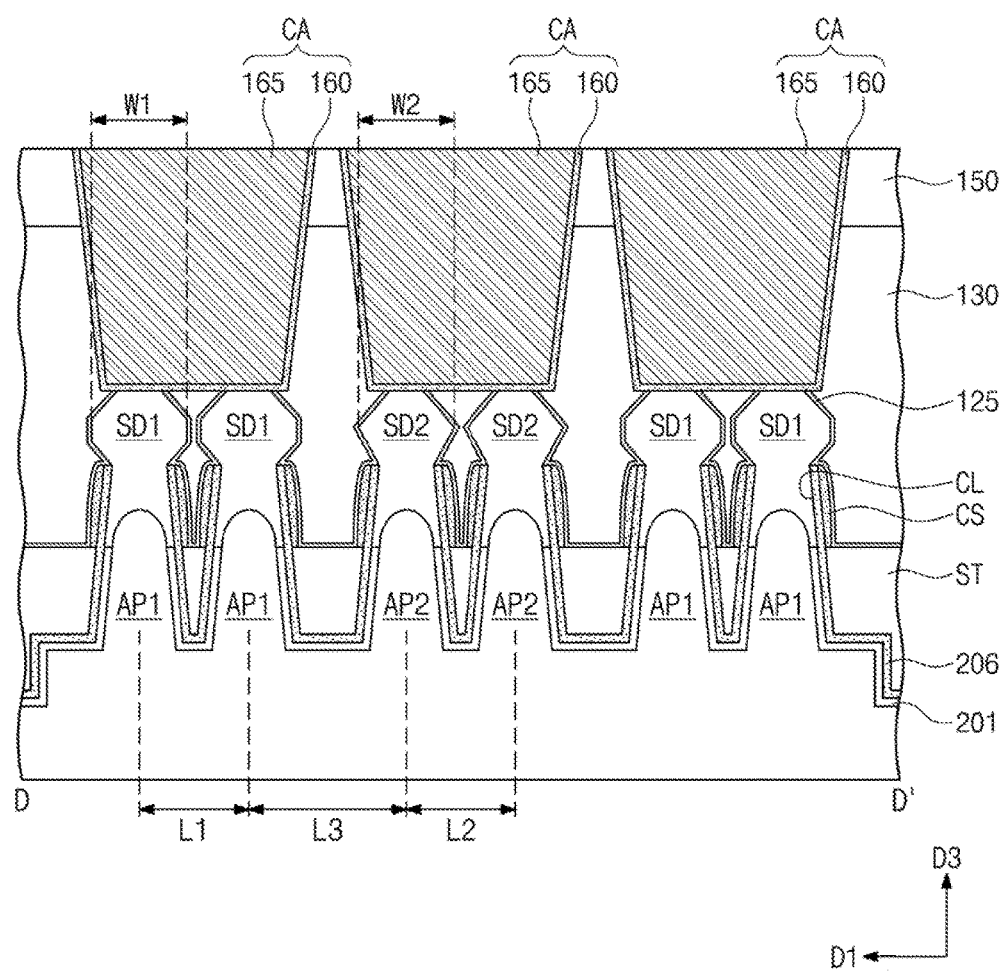
Figure 3A:
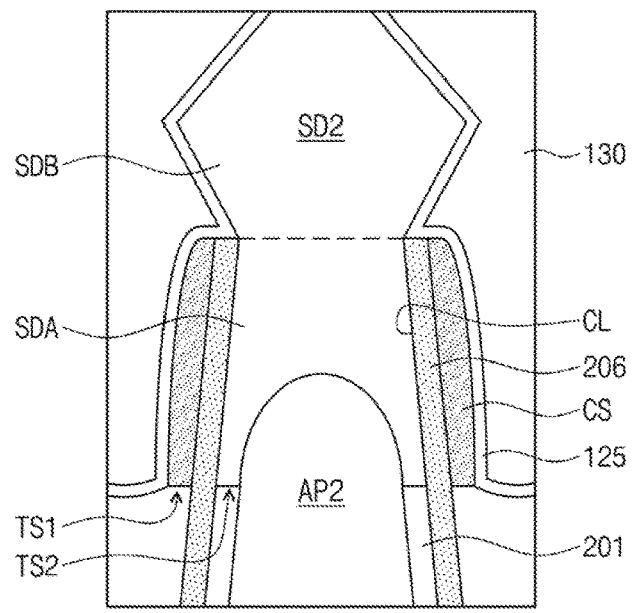
FIGS. 3A, 3B, and 3C are enlarged views of a portion of FIG. 2C.
Figure 3B:
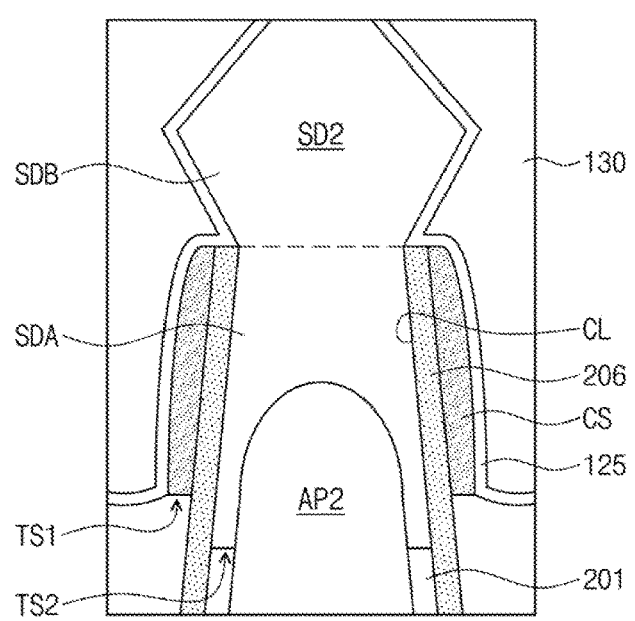
Figure 3C:
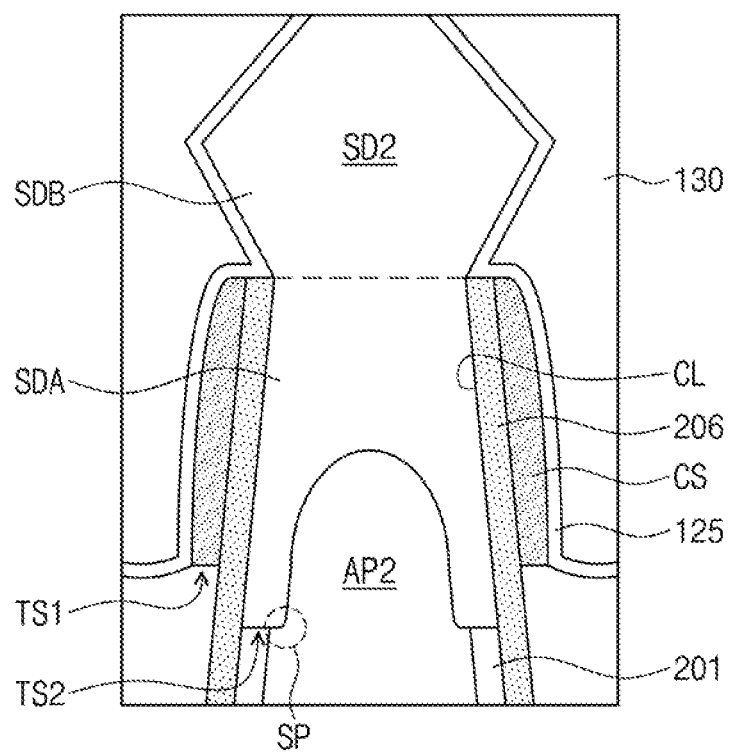

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). FIG. 1 is a plan view illustrating a semiconductor device according to some exemplary implementations. FIG. 2A is a cross-sectional view taken along lines A-A' and B-B' of FIG. 1, and FIGS. 2B and 2C are cross-sectional views taken along lines C-C' and D-D' of FIG. 1, respectively. FIGS. 3A, 3B, and 3C are enlarged views of a portion of FIG. 2C.

Exemplary implementations described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

As shown in FIGS. 1, 2A, 2B, and 2C, a substrate 100 including a first region R1 may be provided. The substrate 100 may be a semiconductor substrate. For example, the substrate 100 may be a silicon substrate, a germanium substrate, or a silicon-on-insulator (SOI) substrate. The first region R1 may correspond to a portion of a memory cell region on which a plurality of memory cells for storing data are formed. In some exemplary implementations, memory cell transistors constituting a plurality of 6T static random access memory (SRAM) cells may be disposed on the first region R1. Each of the 6T SRAM cells may have six transistors. However, exemplary implementations are not limited thereto.

The first region R1 may include a first NMOSFET region NR1 and a first PMOSFET region PR1. The first NMOSFET region NR1 may correspond to an active region on which an N-type MOS transistor is disposed, and the first PMOSFET region PR1 may correspond to an active region on which a P-type MOS transistor is disposed. A plurality of first NMOSFET regions NR1 may be provided and a plurality of first PMOSFET regions PR1 may be provided. The first NMOSFET regions NR1 and the first PMOSFET regions PR1 may be arranged along a first direction D1. In some exemplary implementations, the NMOSFET regions NR1 and the PMOSFET regions PR1 may be alternately arranged in the first direction D1.

Active patterns AP1 and AP2 may be provided on the first region R1. In more detail, first active patterns AP1 protruding from the substrate 100 may be disposed on the first NMOSFET region NR1 of the first region R1. The first active patterns AP1 may be arranged along the first direction D1 and may have linear shapes extending in a second direction D2 intersecting the first direction D1.

Second active patterns AP2 protruding from the substrate 100 may be disposed on the first PMOSFET region PR1 of the first region R1. The second active patterns AP2 may be arranged along the first direction D1 and may have linear shapes extending in the second direction D2. A width in the first direction D1 of each of the first and second active patterns AP1 and AP2 may increase as a vertical height from the substrate 100 decreases.

The active patterns AP1 and AP2 may be spaced apart from each other at different distances in the first direction D1. In some exemplary implementations, a distance in the first direction D1 between the first active patterns AP1 on the first NMOSFET region NR1 may be defined as a first length L1. A distance in the first direction D1 between the second active patterns AP2 on the first PMOSFET region PR1 may be defined as a second length L2. Meanwhile, a distance in the first direction D1 between the first active pattern AP1 and the second active pattern AP2 adjacent to each other may be defined as a third length L3. The second length L2 may be greater than the first length L1, and the third length L3 may be greater than the second length L2. Each of the first to third lengths L1, L2, and L3 may correspond to a distance between a center of one active pattern and a center of another active pattern adjacent to the one active pattern.

Device isolation patterns ST may be disposed to fill a trench between the first active patterns AP1 and a trench between the second active patterns AP2. In other words, the first and second active patterns AP1 and AP2 may be defined by the device isolation patterns ST. The first and second active patterns AP1 and AP2 may respectively include first and second fin patterns AF1 and AF2 that protrude from the device isolation patterns ST and overlap with a gate structure to be described later.

The device isolation patterns ST may extend between the first NMOSFET region NR1 and the first PMOSFET region PR1 and between neighboring MOSFET regions. In some exemplary implementations, the device isolation patterns ST may include first device isolation patterns and second device isolation patterns. The second device isolation patterns may fill the trench between the first active patterns AP1 and the trench between the second active patterns AP2, and the first device isolation patterns may extend between the first NMOSFET region NR1 and the first PMOSFET region PR1 and between neighboring MOSFET regions. The first device isolation patterns and the second device isolation patterns may correspond to portions of an insulating layer that is in one body. The first device isolation patterns may be thicker than the second device isolation patterns. In this case, the first device isolation patterns may be formed by a process different from a process of forming the second device isolation patterns. In certain exemplary implementations, the first device isolation patterns may be formed simultaneously with the second device isolation patterns and may have the substantially same thickness as the second device isolation patterns. The first and second device isolation patterns may be formed of a high-density plasma (HDP) oxide layer, a tetraethylorthosilicate (TEOS) layer, a plasma enhanced tetraethylorthosilicate (PE-TEOS) layer, an O3-tetraethylorthosilicate (O3-TEOS) layer, an undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin on glass (SOG) layer, or any combination thereof.

A liner insulating layer may be provided on sidewalls of the active patterns AP1 and AP2. The liner insulating layer may extend between the device isolation patterns ST and the active patterns AP1 and AP2. In some embodiments, the liner insulating layer may extend along sidewalls and bottom surfaces of the device isolation patterns ST. In certain exemplary implementations, the liner insulating layer may extend onto the bottom surfaces of the second device isolation patterns but does not extend onto the bottom surfaces of the first device isolation patterns.

The liner insulating layer may include a first liner insulating layer 201 disposed on the sidewalls of the active patterns AP1 and AP2 and a second liner insulating layer 206 disposed on the first liner insulating layer 201. For example, the first liner insulating layer 201 may include a silicon oxide layer. For example, the second liner insulating layer 206 may include a silicon nitride layer or a silicon oxynitride layer.

Gate structures may be provided on the first and second active patterns AP1 and AP2. The gate structures may extend in the first direction D1 to intersect the first and second active patterns AP1 and AP2. Each of the gate structures may include a gate electrode GE, an interface layer IL between the gate electrode GE and the first and second active patterns AP1 and AP2, a gate insulating pattern GI provided between the interface layer IL and the gate electrode GE and extending onto sidewalls of the gate electrode GE, first spacers GS disposed on the sidewalls of the gate electrode GE, and a capping pattern GP disposed on the gate electrode GE.

The gate electrodes GE may cover top surfaces and sidewalls of the first and second fin patterns AF1 and AF2. The gate electrodes GE may be spaced apart from each other in the second direction D2. The gate insulating pattern GI may extend from the active patterns AP1 and AP2 along the gate electrode GE so as to be disposed between the gate electrode GE and the device isolation patterns ST.

The gate electrodes GE may include at least one of a doped semiconductor material, a conductive metal nitride (e.g., titanium nitride or tantalum nitride), or a metal (e.g., aluminum or tungsten). For example, the interface layer IL may include a silicon oxide layer. The gate insulating pattern GI may include at least one of a silicon oxide layer, a silicon oxynitride layer, or a high-k dielectric layer having a dielectric constant higher than that of a silicon oxide layer. For example, the high-k dielectric layer may include a hafnium oxide layer, a hafnium silicate layer, a zirconium oxide layer, or a zirconium silicate layer. The capping pattern GP may include at least one of silicon oxide, silicon nitride, or silicon oxynitride. The first spacers GS may include at least one of silicon oxynitride or silicon oxycarbonitride (SiOCN).

Source/drain regions SD1 and SD2 may be provided on the first and second active patterns AP1 and AP2 at both, opposite sides of each of the gate electrodes GE. Each of the first and second active patterns AP1 and AP2 may include first portions overlapping with the gate electrodes GE and second portions overlapping with the source/drain regions SD1 and SD2. Top surfaces of the second portions may be lower than top surfaces of the first portions. In detail, first source/drain regions SD1 may be disposed on the second portions of the first active patterns AP1. Second source/drain regions SD2 may be disposed on the second portions of the second active patterns AP2. In some exemplary implementations, the first source/drain regions SD1 on the first NMOSFET region NR1 may have an N-type conductivity, and the second source/drain regions SD2 on the first PMOSFET region PR1 may have a P-type conductivity.

The first fin patterns AF1 between the first source/drain regions SD1 may correspond to channel regions of NMOS field effect transistors, and the second fin patterns AF2 between the second source/drain regions SD2 may correspond to channel regions of PMOS field effect transistors.

Second spacers CS may be provided on sidewalls of the second liner insulating layer 206. The second spacers CS may be in contact with top surfaces of the device isolation patterns ST. Alternatively, the second spacers CS may be spaced apart from the device isolation patterns ST. The second spacers CS may be formed on sidewalls of the source/drain regions SD1 and SD2 as illustrated in FIG. 2C but may not be formed on the fin patterns AF1 and AF2. For example, the second spacers CS may be provided on portions exposed by the gate structures. The second spacers CS may be formed of the same material as the first spacers GS. For example, the second spacers CS may include at least one of silicon oxynitride or silicon oxycarbonitride (SiOCN).

FIGS. 3A, 3B, and 3C are enlarged views of a portion of FIG. 2C. FIGS. 3A, 3B, and 3C illustrate the first PMOSFET region PR1. However, the following technical descriptions may be applied to the first NMOSFET region NR1.

Shapes of the liner insulating layer, the second spacers, and the source/drain regions will be described in more detail with reference to FIGS. 1, 2A, 2B, 2C, 3A, 3B, and 3C.

Upper portions of the first and second active patterns AP1 and AP2 may be inserted in lower portions of the first and second source/drain regions SD1 and SD2. Thus, the lower portions of the first and second source/drain regions SD1 and SD2 may extend onto sidewalls of the upper portions of the first and second active patterns AP1 and AP2. The upper portions of the first and second active patterns AP1 and AP2 may have rounded surfaces. This may be caused by an etching process to be described later. For example, the upper portions of the first and second active patterns AP1 and AP2 may have curvatures convex in a direction away from the substrate 100.

In a region overlapping with the gate structure, a top surface of the first liner insulating layer 201 may be disposed at the substantially same height (or level) as a top surface of the second liner insulating layer 206. On the contrary, top surfaces of the first and second liner insulating layers 201 and 206 adjacent to the source/drain regions SD1 and SD2 may be disposed at heights (or levels) different from each other. In more detail, the top surface of the second liner insulating layer 206 adjacent to each of the source/drain regions SD1 and SD2 may be higher than the top surface of the first liner insulating layer 201 adjacent to each of the source/drain regions SD1 and SD2.

The second liner insulating layer 206 may protrude upward from the top surface of the device isolation pattern ST. In some exemplary implementations, the top surface TS2 of the first liner insulating layer 201 may be disposed at the substantially same level as the top surface TS1 of the device isolation pattern ST, as illustrated in FIG. 3A. In certain exemplary implementations, the top surface TS2 of the first liner insulating layer 201 may be lower than the top surface TS1 of the device isolation pattern ST, as illustrated in FIG. 3B. In the present specification, a height (or a level) of a specific surface may be defined in relation to the top surface of the substrate 100.

In some exemplary implementations, sidewalls of the active patterns AP1 and AP2 may not have a stepped portion in regions adjacent to interfaces between the first liner insulating layer 201 and the source/drain regions SD1 and SD2, as illustrated in FIGS. 3A and 3B. Alternatively, each of the active patterns AP1 and AP2 may have a stepped portion SP in the region adjacent to the interface between the first liner insulating layer 201 and each of the source/drain regions SD1 and SD2 (i.e., in a region adjacent to the top surface TS2 of the first liner insulating layer 201), as illustrated in FIG. 3C. The stepped portion SP may be formed during a process of etching an upper portion of the first liner insulating layer 201 in a manufacturing method to be described later. Alternatively, when the upper portions of the active patterns AP1 and AP2 are etched prior to the upper portion of the first liner insulating layer 201, the stepped portion SP may not be formed, as illustrated in FIGS. 3A and 3B.

Each of the source/drain regions SD1 and SD2 may include a first portion SDA and a second portion SDB. The first portion SDA may be provided in a recess region CL defined by the second liner insulating layer 206. The second portion SDB may protrude upward from the second liner insulating layer 206 and may cover the top surface of the first liner insulating layer 201. A width in the first direction of the second portion SDB may be greater than a width in the first direction of the first portion SDA. In the present specification, a width in one direction may mean the maximum width in the corresponding direction. The first portion SDA may extend between the second liner insulating layer 206 and each of the active patterns AP1 and AP2. In other words, the first liner insulating layer 201 and the first portion SDA may be respectively provided in a lower portion and an upper portion of a region between the second liner insulating layer 206 and each of the active patterns AP1 and AP2.

Thus, the first and second source/drain regions SD1 and SD2 may be epitaxial patterns formed using the first and second active patterns AP1 and AP2 disposed thereunder as seeds, respectively. In this case, the first source/drain regions SD1 may include a material capable of providing a tensile strain to the first fin patterns AF1, and the second source/drain regions SD2 may include a material capable of providing a compressive strain to the second fin patterns AF2. In some exemplary implementations, when the substrate 100 is a silicon substrate, the first source/drain regions SD1 may include a silicon carbide (SiC) layer having a lattice constant smaller than that of silicon, or a silicon layer having a lattice constant substantially equal to that of the substrate 100. In addition, the second source/drain regions SD2 may include a silicon-germanium (SiGe) layer having a lattice constant greater than that of silicon.

As shown in FIG. 2C, shapes of the first source/drain regions SD1 may be different from those of the second source/drain regions SD2 when viewed from a cross-sectional view. This may be because the first and second source/drain regions SD1 and SD2 are epitaxially grown using materials different from each other, as described above. In detail, the maximum width in the first direction D1 of the first source/drain region SD1 may be defined as a first width W1, and the maximum width in the first direction D1 of the second source/drain region SD2 may be defined as a second width W2. Here, the first width W1 and the second width W2 may be different from each other.

Meanwhile, the maximum widths W1 of the first source/drain regions SD1 may be different from each other. When the first source/drain regions SD1 include silicon, the epitaxial growth of the first source/drain regions SD1 may be irregularly performed. Thus, a shape and a size of the first source/drain region SD1 may be varied according to a position of the first source/drain region SD1. In other words, the shapes and the sizes of the first source/drain regions SD1 respectively disposed at different positions may be different from each other. In addition, the second width W2 is greater than the first width W1 in FIG. 2C. However, exemplary implementations are not limited thereto. In certain exemplary implementations, the first width W1 may be greater than the second width W2.

An etch stop layer 125 may be disposed on the substrate 100. The etch stop layer 125 may cover the top surfaces of the device isolation patterns ST. The etch stop layer 125 may cover the first and second source/drain regions SD1 and SD2 and may extend onto sidewalls of the first spacers GS. The etch stop layer 125 may include a material having an etch selectivity with respect to a first interlayer insulating layer 130 to be described later. For example, the etch stop layer 125 may include a silicon nitride layer or a silicon oxynitride layer.

A first interlayer insulating layer 130 may be disposed on the substrate 100 to fill spaces between the gate electrodes GE and spaces between the source/drain regions SD1 and SD2. A top surface of the first interlayer insulating layer 130 may be substantially coplanar with top surfaces of the capping patterns GP. A second interlayer insulating layer 150 may be disposed on the first interlayer insulating layer 130. Each of the first and second interlayer insulating layers 130 and 150 may include a silicon oxide layer.

Source/drain contacts CA may be disposed at both sides of each of the gate electrodes GE. The source/drain contacts CA may penetrate the second interlayer insulating layer 150, the first interlayer insulating layer 130, and the etch stop layer 125 so as to be electrically connected to the first and second source/drain regions SD1 and SD2. Each of the source/drain contacts CA may intersect at least one first active pattern AP1 or at least one second active pattern AP2 when viewed from a plan view.

Each of the source/drain contacts CA may include a first conductive pattern 160 and a second conductive pattern 165 disposed on the first conductive pattern 160. The first conductive pattern 160 may be a barrier conductive pattern. For example, the first conductive pattern 160 may include at least one of titanium nitride, tungsten nitride, or tantalum nitride. The second conductive pattern 165 may be a metal pattern. For example, the second conductive pattern 165 may include at least one of tungsten, titanium, or tantalum. Even though not shown in the drawings, a metal silicide layer may be disposed between each of the source/drain contacts CA and each of the first and second source/drain regions SD1 and SD2. For example, the metal silicide layer may include at least one of titanium-silicide, tantalum-silicide, or tungsten-silicide.

According to some exemplary implementations of the herein described subject matter, each of the source/drain regions SD1 and SD2 may include the first portion SDA defined by the second liner insulating layer 206, and the second portion SDB disposed on the first portion SDA and protruding upward from the second liner insulating layer 206. As described below in the following manufacturing method, the source/drain regions SD1 and SD2 may be grown using the active patterns AP1 and AP2 thereunder as seeds. Here, the first portions SDA may be grown using the second liner insulating layer 206 as a mold. Source/drain regions may require specific volumes to prevent source/drain resistances (Rsd) from excessively increasing. However, distances between source/drain regions may be reduced as the integration density of semiconductor devices increases. In addition, source/drain regions may be grown in a vertical direction and a lateral direction at the same time due to characteristics of an epitaxial process. Thus, neighboring source/drain regions may come in contact with each other.

According to some exemplary implementations, the second liner insulating layer 206 may limit the lateral growth (or horizontal growth) of the first portion SDA during the formation of the first portion SDA. Since the second liner insulating layer 206 does not spatially limit the growth of the second portion SDB, the second portion SDB may be grown in the vertical direction and the lateral direction at the same time. In other words, the lateral growth may be limited in the early stage of the growth of the source/drain regions SD1 and SD2 but may not be limited in the later stage of the growth of the source/drain regions SD1 and SD2. Thus, the source/drain regions SD1 and SD2 may have required volumes and it is possible to solve the undesired contact problem between source/drain regions.

Next, a second region R2 will be described. The second region R2 may correspond to a portion of a logic cell region on which logic transistors constituting a logic circuit are disposed. In some exemplary implementations, the second region R2 may be a region on which logic transistors constituting a processor core or an input/output (I/O) terminal are formed. However, exemplary implementations are not limited thereto. Layers on the second region R2 may be formed together with the layers on the first region R1. Hereinafter, the detailed descriptions to the same technical features as the first region R1 will be omitted or mentioned briefly for the purpose of ease and convenience in explanation. A cross section of the second region R2 taken along the second direction D2 may be similar to that of the first region R1 illustrated in FIG. 2A.

Figure 4:
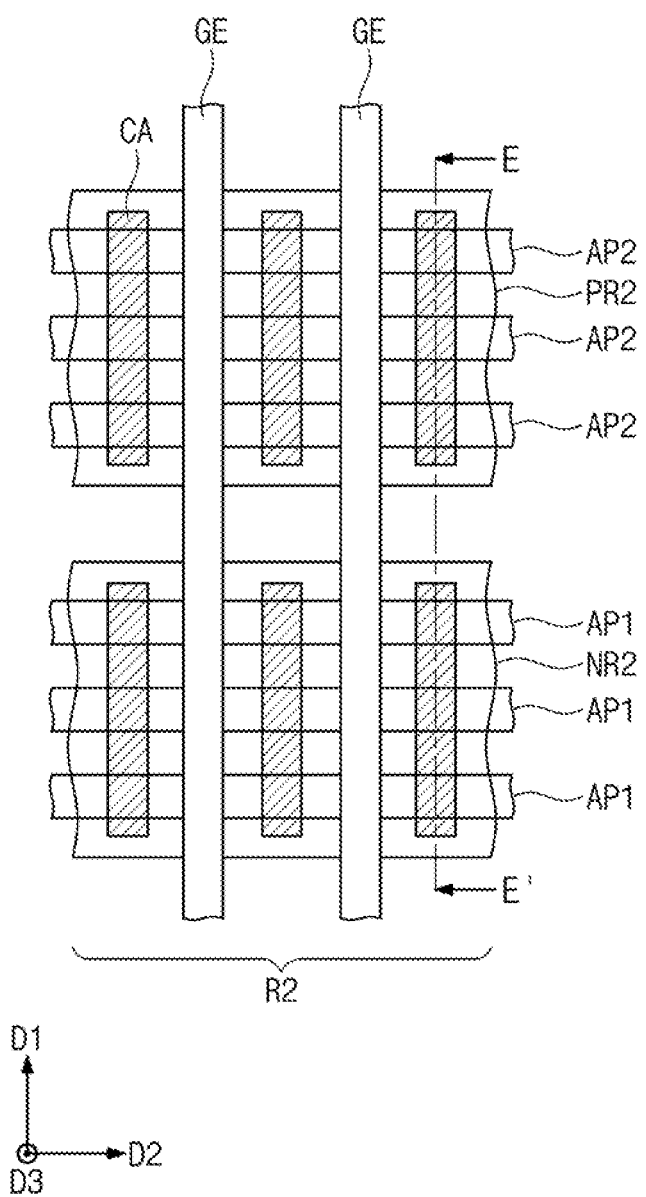
FIG. 4 is a plan view illustrating a semiconductor device according to some exemplary implementations.
Figure 5:
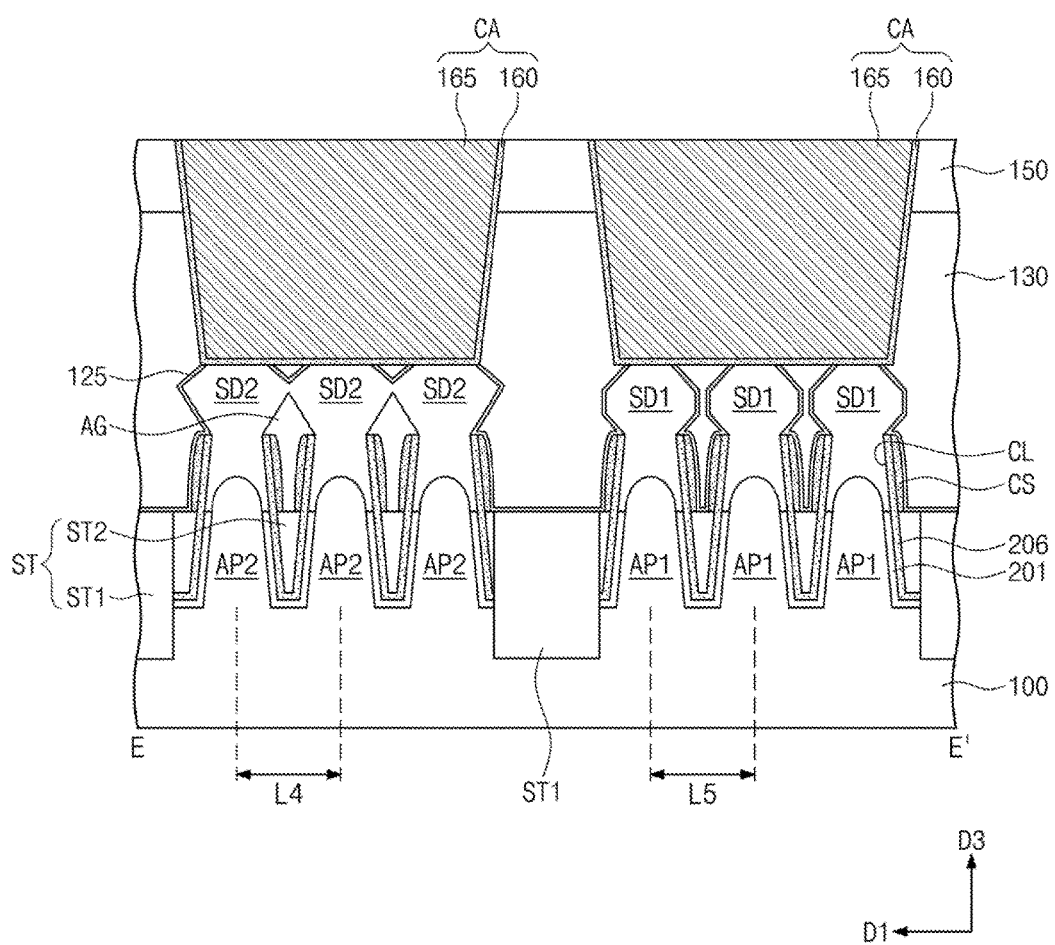
FIG. 5 is a cross-sectional view taken along a line E-E' of FIG. 4.

FIG. 4 is a plan view of second region R2 illustrating a semiconductor device according to some exemplary implementations. FIG. 5 is a cross-sectional view taken along a line E-E' of FIG. 4.

As shown in FIGS. 4 and 5, the second region R2 may include a second NMOSFET region NR2 and a second PMOSFET region PR2. The second NMOSFET region NR2 may correspond to an active region on which an N-type MOS transistor is disposed, and the second PMOSFET region PR2 may correspond to an active region on which a P-type MOS transistor is disposed. The second NMOSFET region NR2 may be provided in plurality and the second PMOSFET region PR2 may be provided in plurality. The second NMOSFET regions NR2 and the second PMOSFET regions PR2 may be arranged in the first direction D1. The second NMOSFET region NR2 and the second PMOSFET region PR2 may be isolated from each other by a first device isolation pattern ST1.

Active patterns AP1 and AP2 may be provided on the second region R2. In detail, first active patterns AP1 protruding from the substrate 100 may be disposed on the second NMOSFET region NR2 of the second region R2, and second active patterns AP2 protruding from the substrate 100 may be disposed on the second PMOSFET region PR2 of the second region R2.

The first and second active patterns AP1 and AP2 on the second region R2 may be spaced apart from each other and may be arranged at substantially equal distances. In some embodiments, a distance in the first direction D1 between the second active patterns AP2 on the second PMOSFET region PR2 may be defined as a fourth length L4, and a distance in the first direction D1 between the first active patterns AP1 on the second NMOSFET region NR2 may be defined as a fifth length L5. Here, the fourth length L4 and the fifth length L5 may be substantially equal to each other. Meanwhile, the fourth length L4 may be smaller than the second length L2 described above.

Second device isolation patterns ST2 may fill at least portions of trenches between the first active patterns AP1 and at least portions of trenches between the second active patterns AP2 on the second region R2. The second device isolation patterns ST2 and the first device isolation pattern ST1 may correspond to portions of an insulating layer that is in one body. Gate structure may be provided on the first and second active patterns AP1 and AP2 of the second region R2. The gate structures may extend in the first direction D1 to intersect the first and second active patterns AP1 and AP2 of the second region R2. Source/drain regions SD1 and SD2 may be provided on the first and second active patterns AP1 and AP2 at both sides of a gate electrode GE of each of the gate structures of the second region R2. Meanwhile, the second source/drain regions SD2 on the first region R1 described above may be spaced apart from each other in the first direction D1. However, the second source/drain regions SD2 on the second region R2 may be merged with each other to constitute one source/drain region that is in one body and extends in the first direction D1. This is because the distance between the second active patterns AP2 on the second region R2 is smaller than the distance between the second active patterns AP2 on the first region R1 (L4<L2). Alternatively, the second source/drain regions SD2 of the second region R2 may be spaced apart from each other.

According to some exemplary implementations, first and second liner insulating layers 201 and 206 may be formed after formation of trenches to be filled with the second device isolation patterns ST2 and before formation of the first device isolation pattern ST1. As a result, as illustrated in FIG. 5, the first and second liner insulating layers 201 and 206 may be provided under the second device isolation patterns ST2 but may not be provided under the first device isolation pattern ST1. Alternatively, the first and second liner insulating layers 201 and 206 may be formed before the formation of the first and second device isolation patterns ST1 and ST2, and thus the first and second liner insulating layers 201 and 206 may be provided under all of the first and second device isolation patterns ST1 and ST2, as illustrated in FIGS. 2B and 2C.

An etch stop layer 125 may be disposed on the second region R2. A first interlayer insulating layer 130 may be disposed on the etch stop layer 125. The etch stop layer 125 may cover the top surfaces of the device isolation patterns ST and the first and second source/drain regions SD1 and SD2. When the second source/drain regions SD2 are merged with each other, the etch stop layer 125 and the first interlayer insulating layer 130 may not be provided in a space between the second source/drain regions SD2 adjacent to each other. Thus, air gaps AG may be formed between the second source/drain regions SD2. On the contrary, the first source/drain regions SD1 may not be merged with each other. In this case, the etch stop layer 125 and the first interlayer insulating layer 130 may be provided in a space between the first source/drain regions SD1 adjacent to each other. Since the air gaps AG are provided between the second source/drain regions SD2, parasitic capacitances between the second active patterns AP2 may be reduced. In certain exemplary implementations, the first source/drain regions SD1 may be merged with each other, and thus an air gap may be formed between the first source/drain regions SD1.

Source/drain contacts CA may be disposed at both sides of each of the gate electrodes GE. The source/drain contacts CA may penetrate a second interlayer insulating layer 150, the first interlayer insulating layer 130, and the etch stop layer 125 so as to be electrically connected to the first and second source/drain regions SD1 and SD2.

Figure 6:
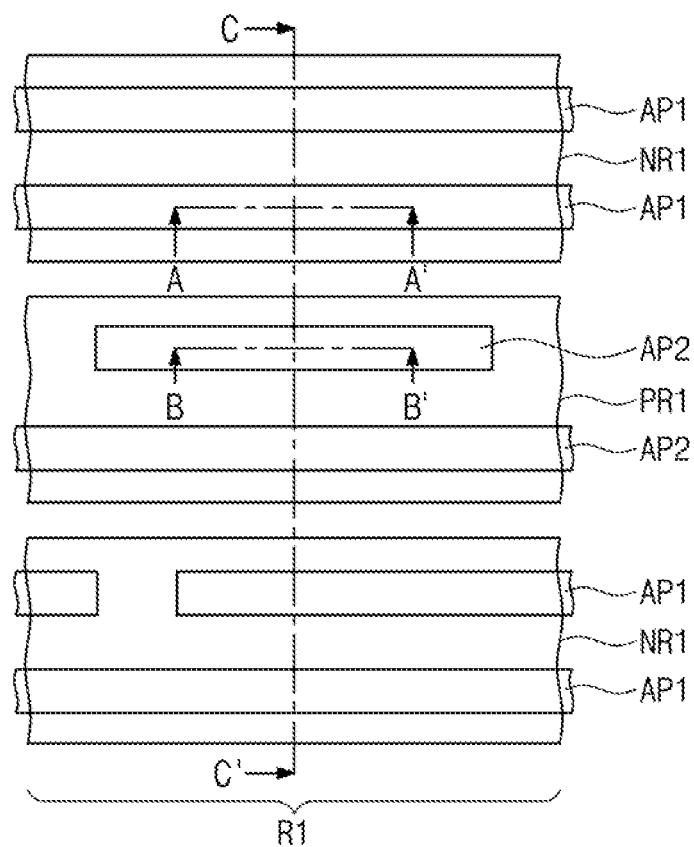
FIGS. 6, 9, and 14 are plan views illustrating a method of manufacturing a semiconductor device, according to some exemplary implementations.
Figure 7A:
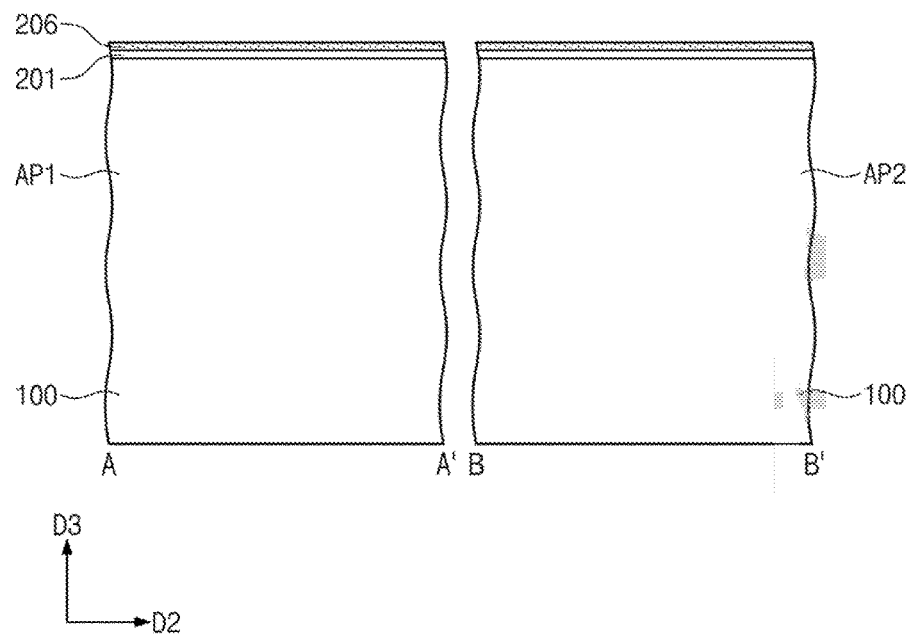
FIG. 7A is a cross-sectional view taken along lines A-A' and B-B' of FIG. 6.
Figure 7B:
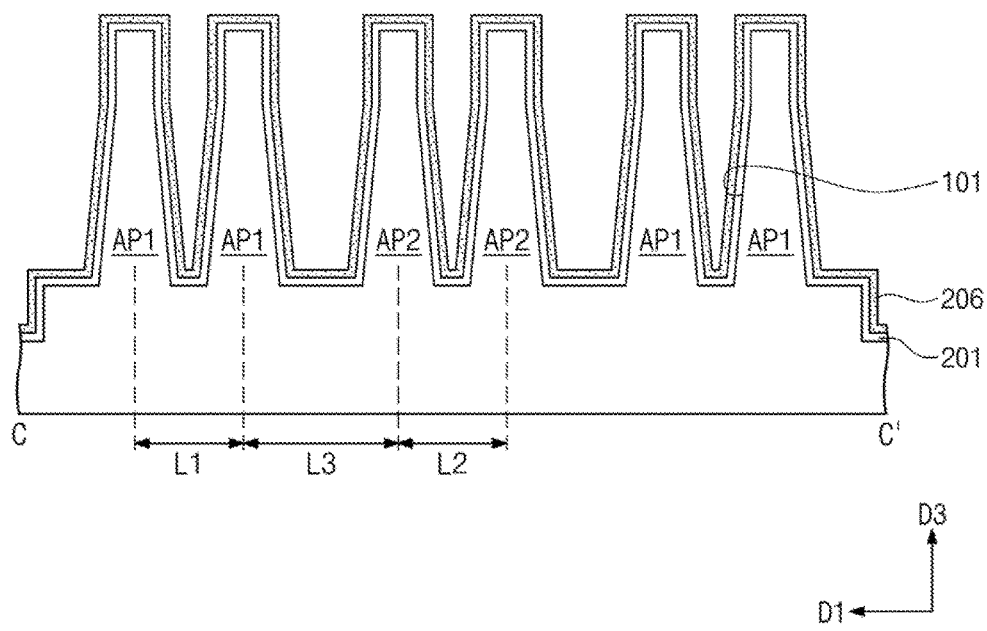
FIG. 7B is a cross-sectional view taken along a line C-C' of FIG. 6.
Figure 8A:
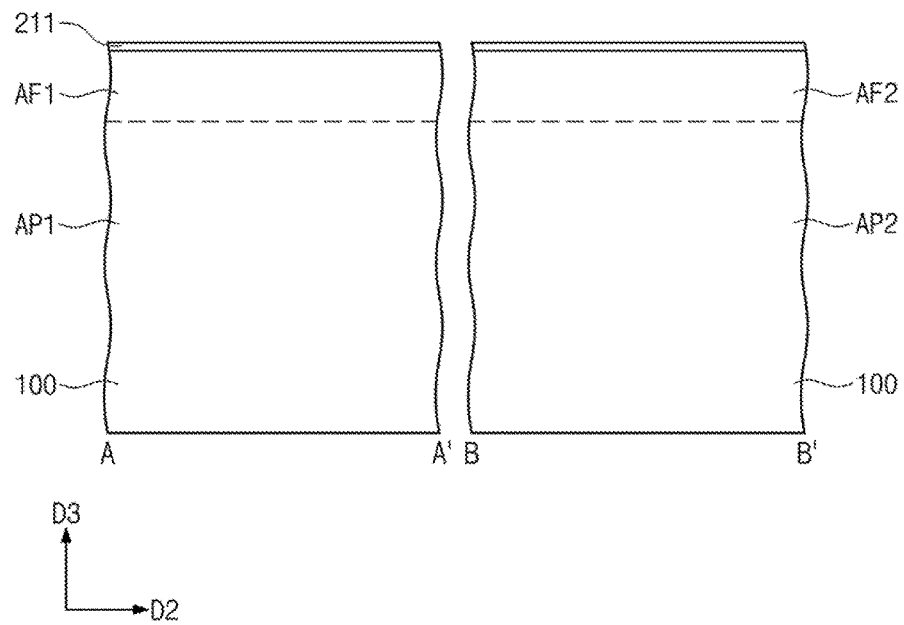
FIG. 8A is a cross-sectional view taken along the lines A-A' and B-B' of FIG. 6.
Figure 8B:
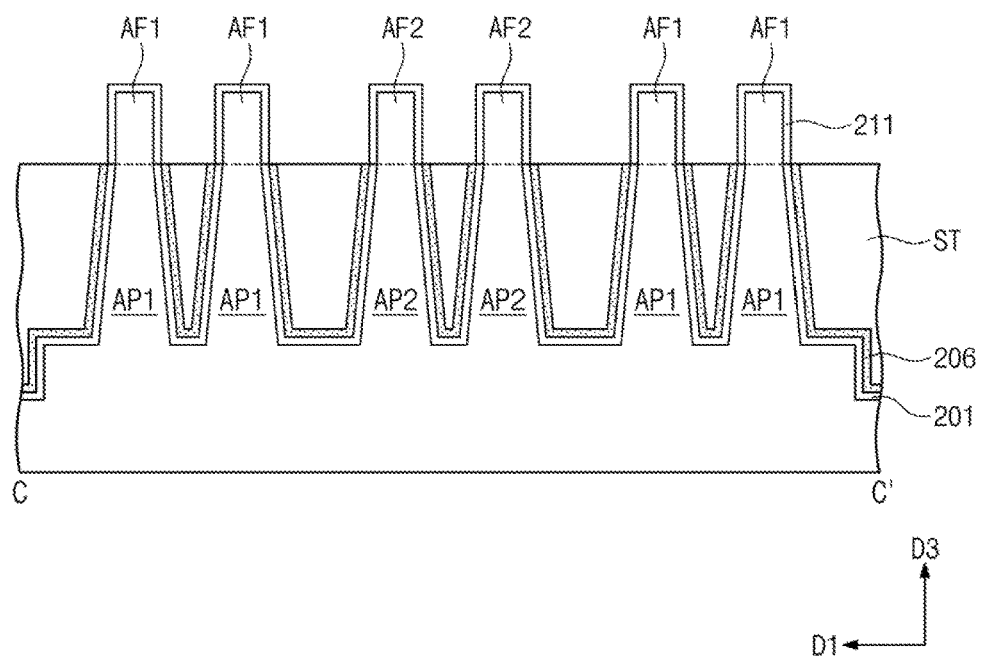
FIG. 8B is a cross-sectional view taken along the line C-C' of FIG. 6.
Figure 9:
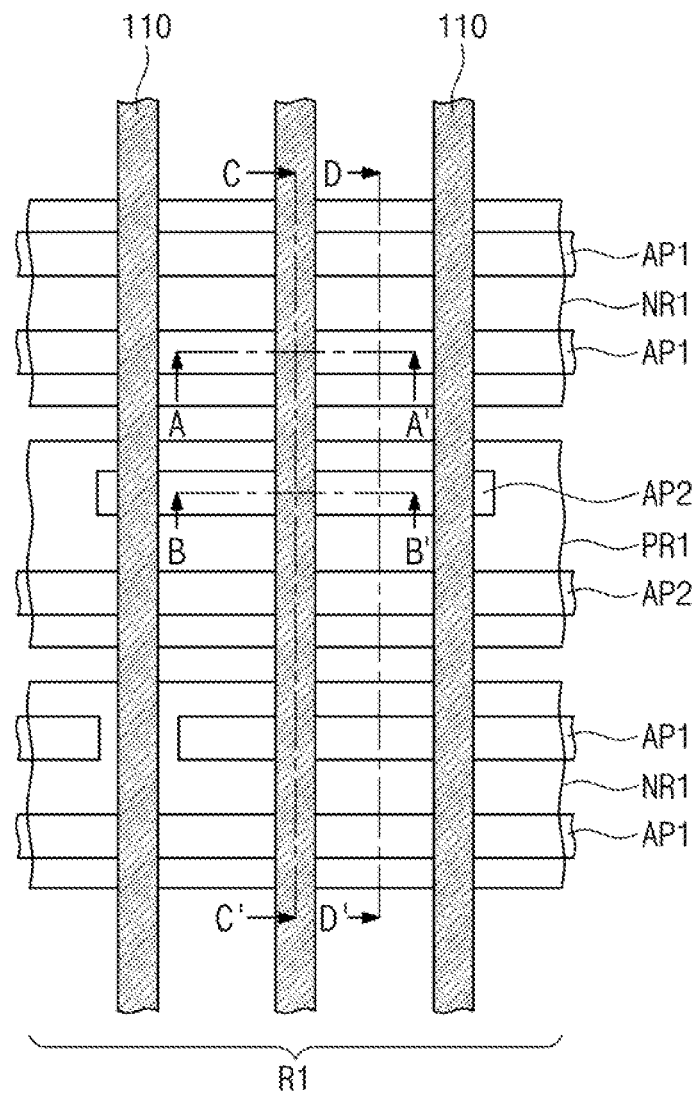
Figure 9:
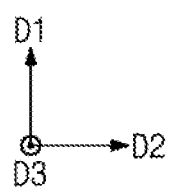
Figure 10A:
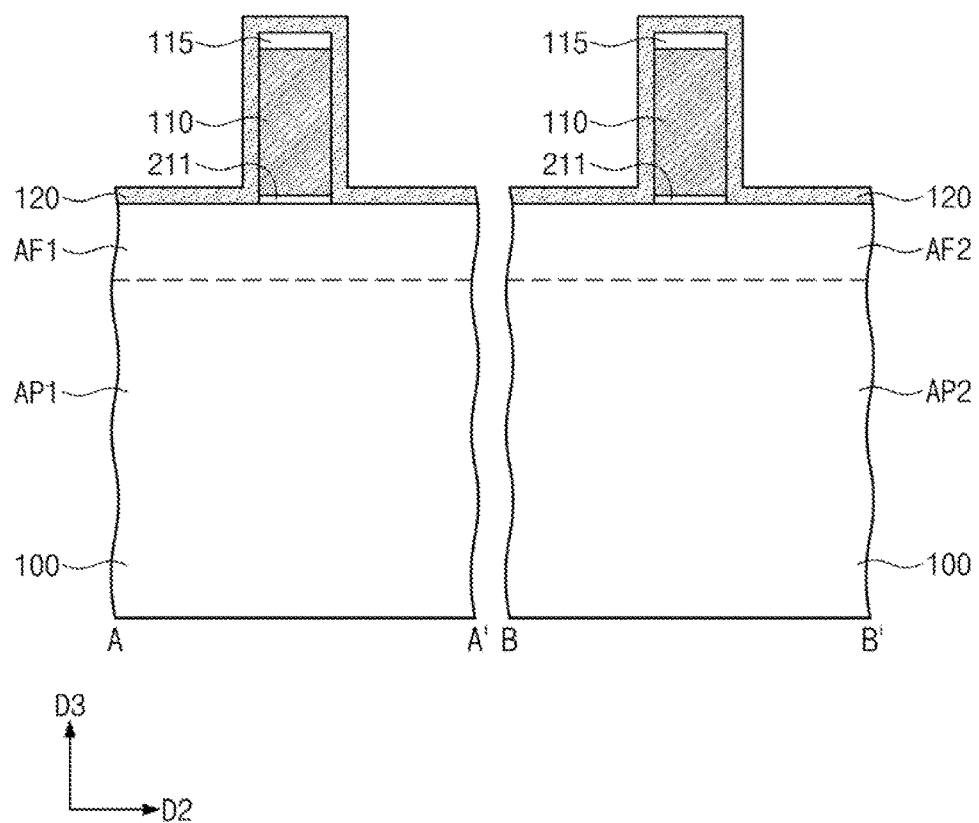
FIG. 10A is a cross-sectional view taken along lines A-A' and B-B' of FIG. 9, and FIGS. 10B and 10C are cross-sectional views taken along lines C-C' and D-D' of FIG. 9, respectively.
Figure 10B:
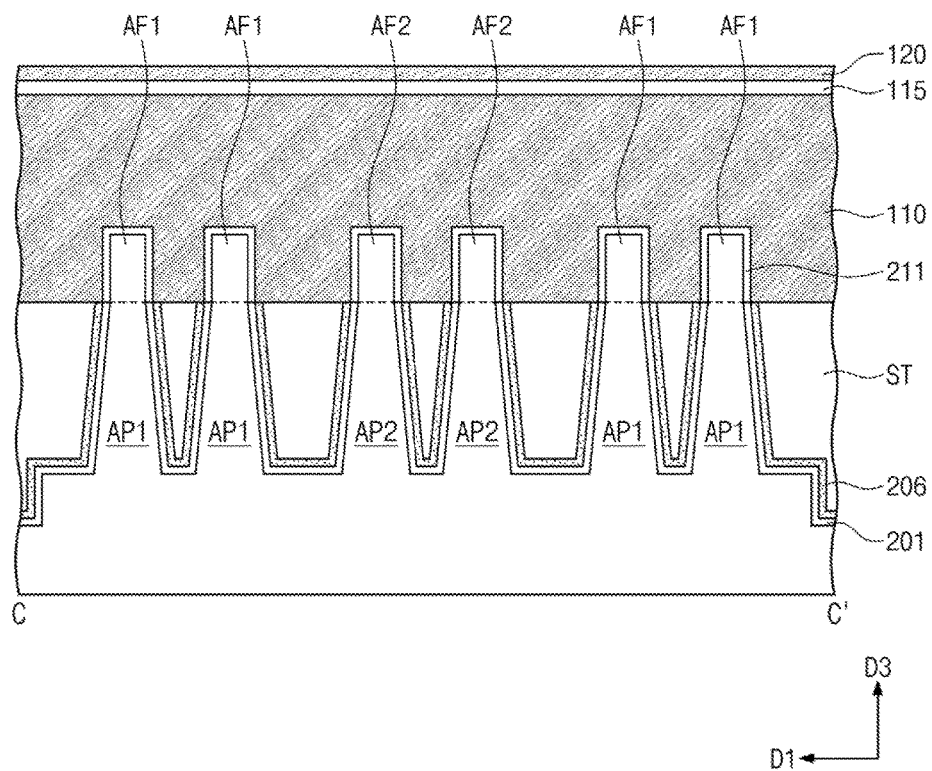
Figure 10C:
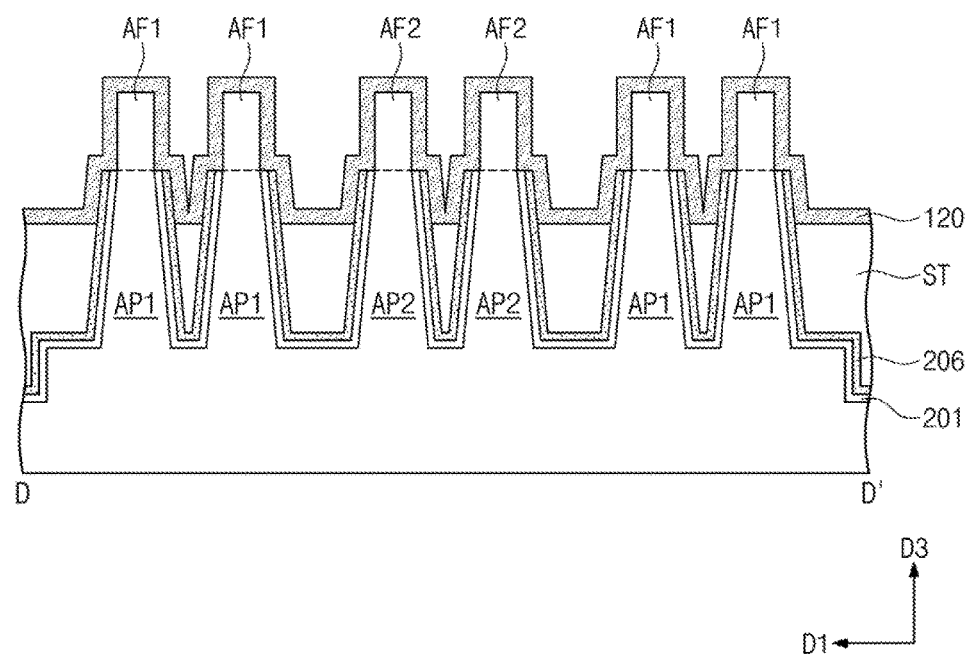
Figure 11A:
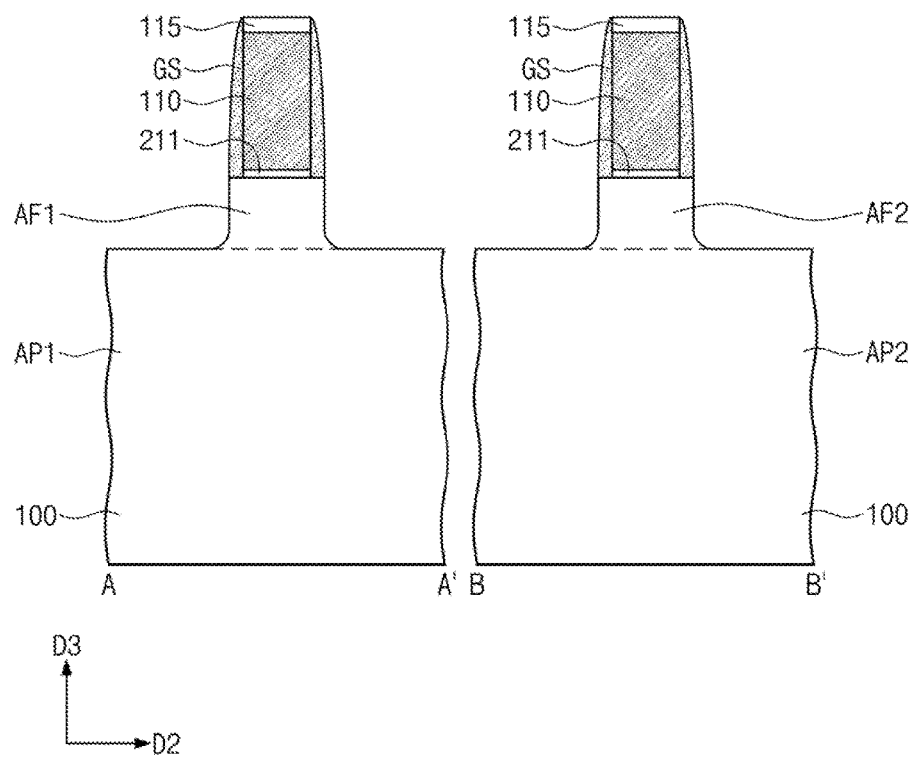
FIG. 11A is a cross-sectional view taken along the lines A-A' and B-B' of FIG. 9, and FIGS. 11B and 11C are cross-sectional views taken along the lines C-C' and D-D' of FIG. 9, respectively.
Figure 11B:
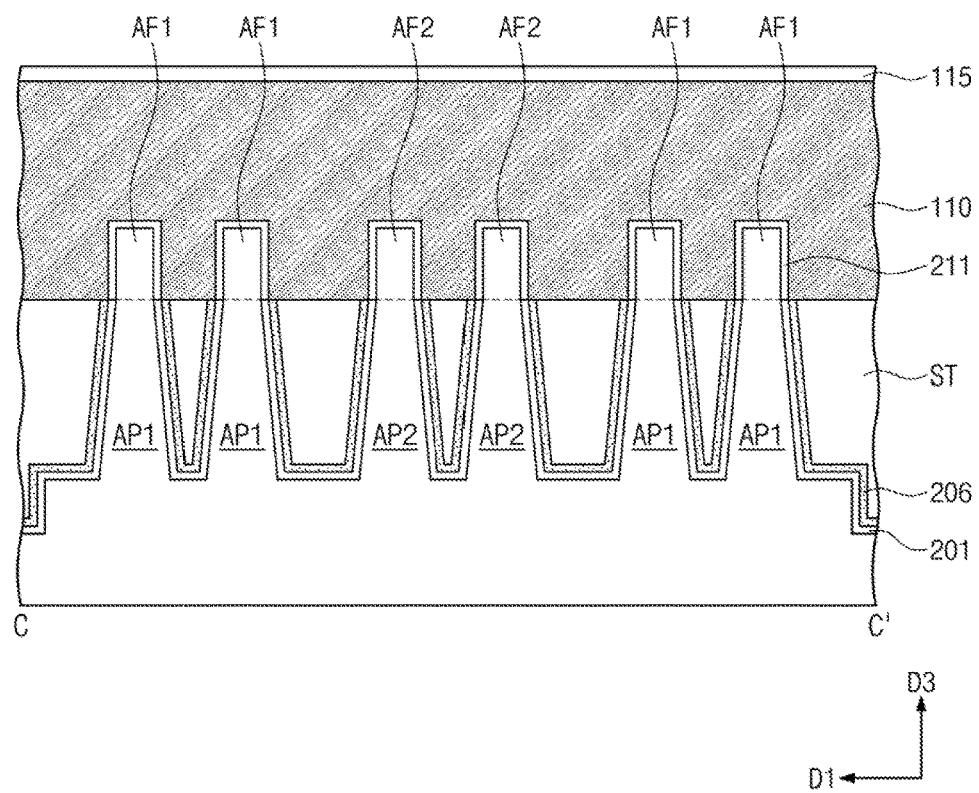
Figure 11C:
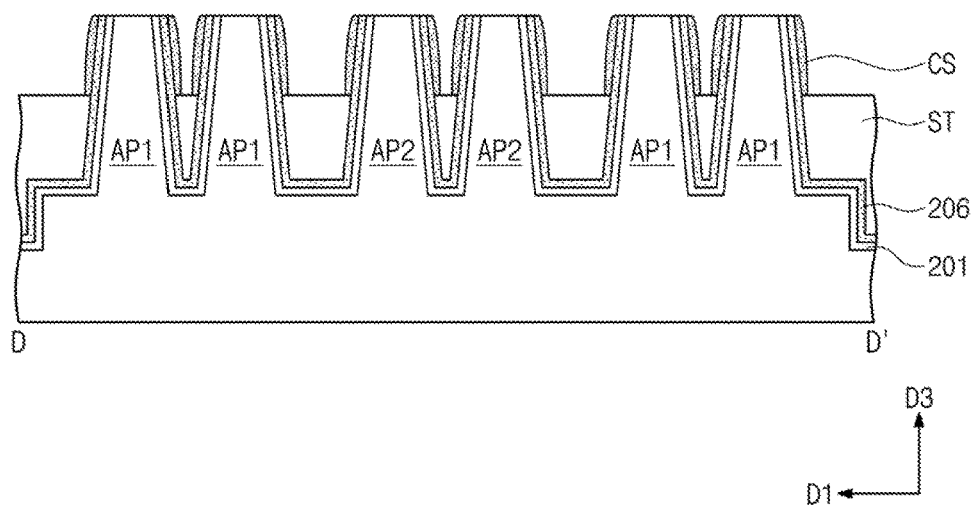
Figure 12A:
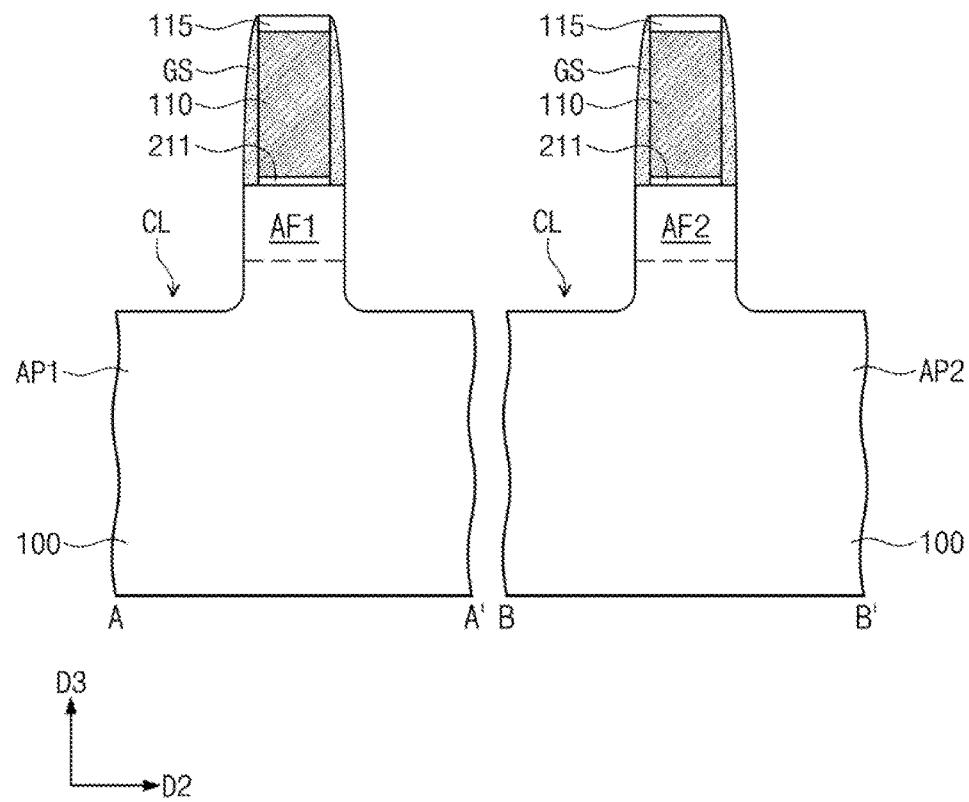
FIG. 12A is a cross-sectional view taken along the lines A-A' and B-B' of FIG. 9, and FIGS. 12B and 12C are cross-sectional views taken along the lines C-C' and D-D' of FIG. 9, respectively.
Figure 12B:
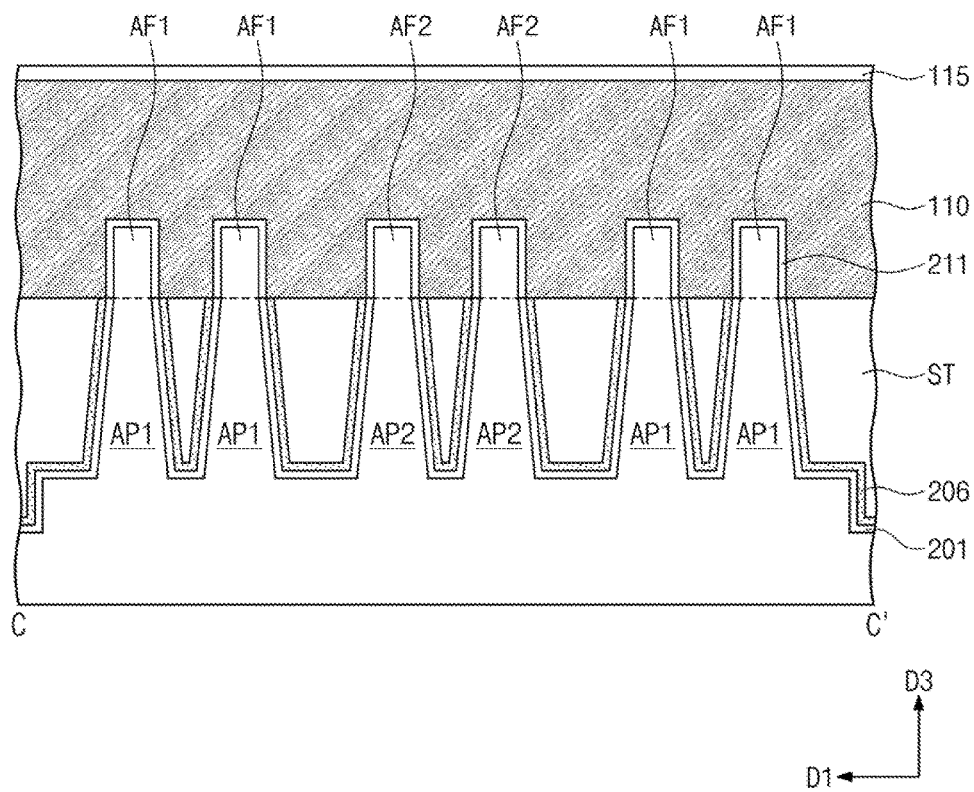
Figure 12C:
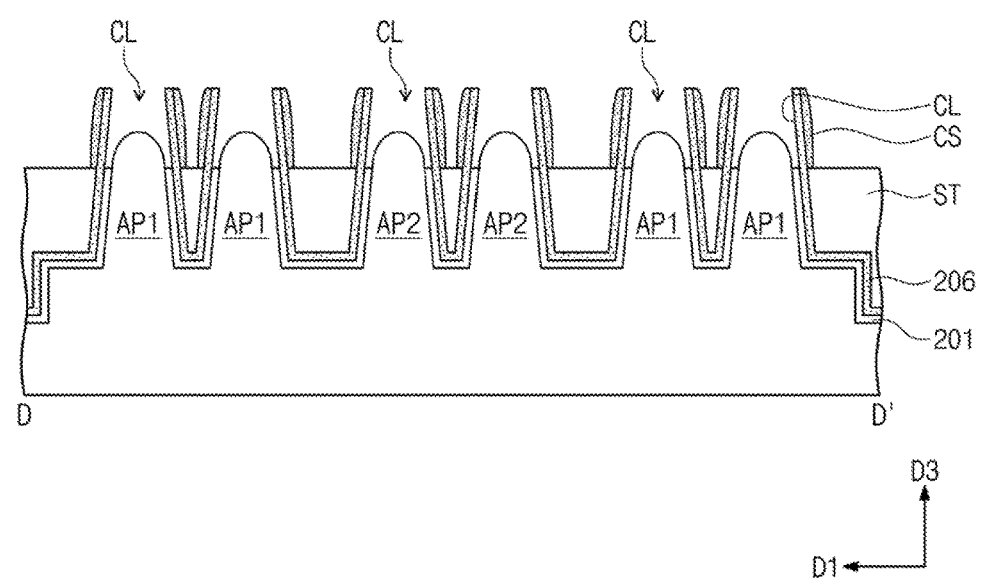
Figure 13A:
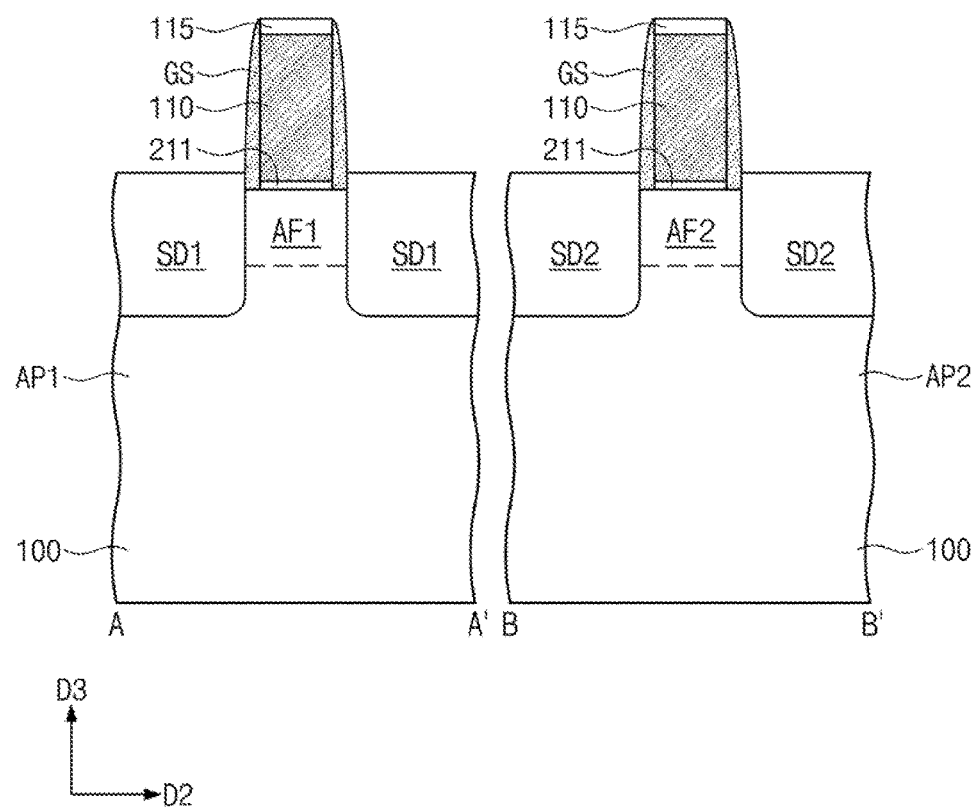
FIG. 13A is a cross-sectional view taken along the lines A-A' and B-B' of FIG. 9, and FIGS. 13B and 13C are cross-sectional views taken along the lines C-C' and D-D' of FIG. 9, respectively.
Figure 13B:
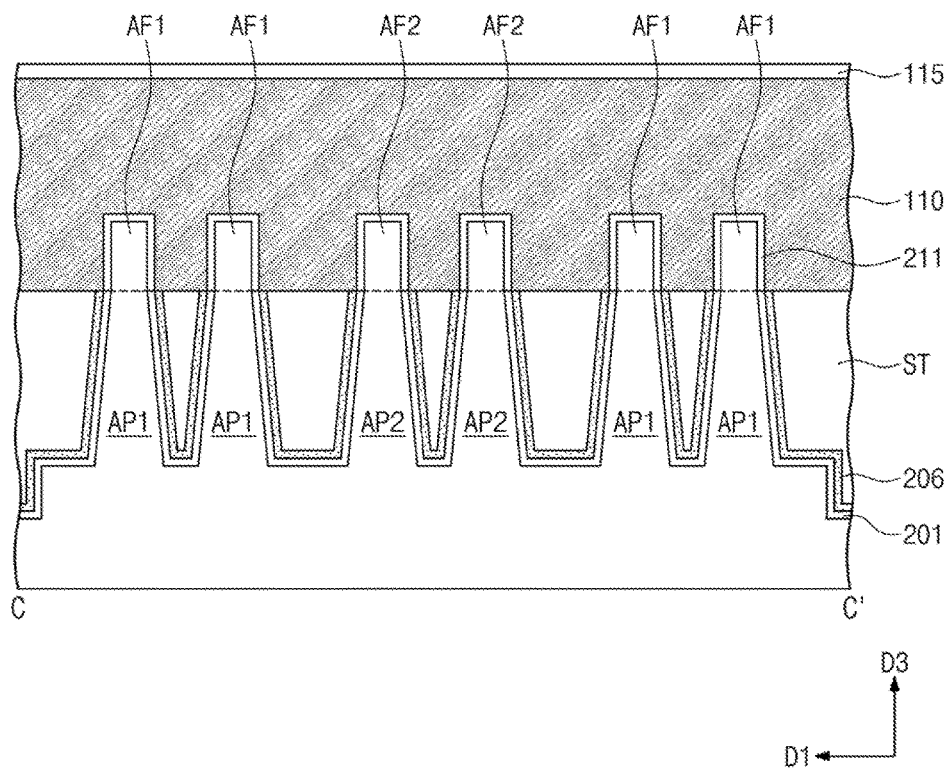
Figure 13C:
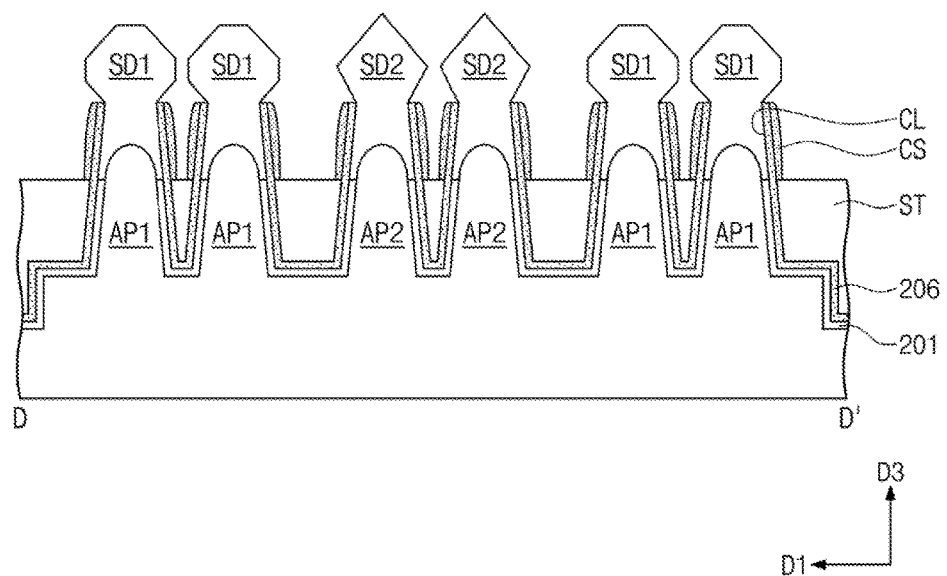
Figure 14:
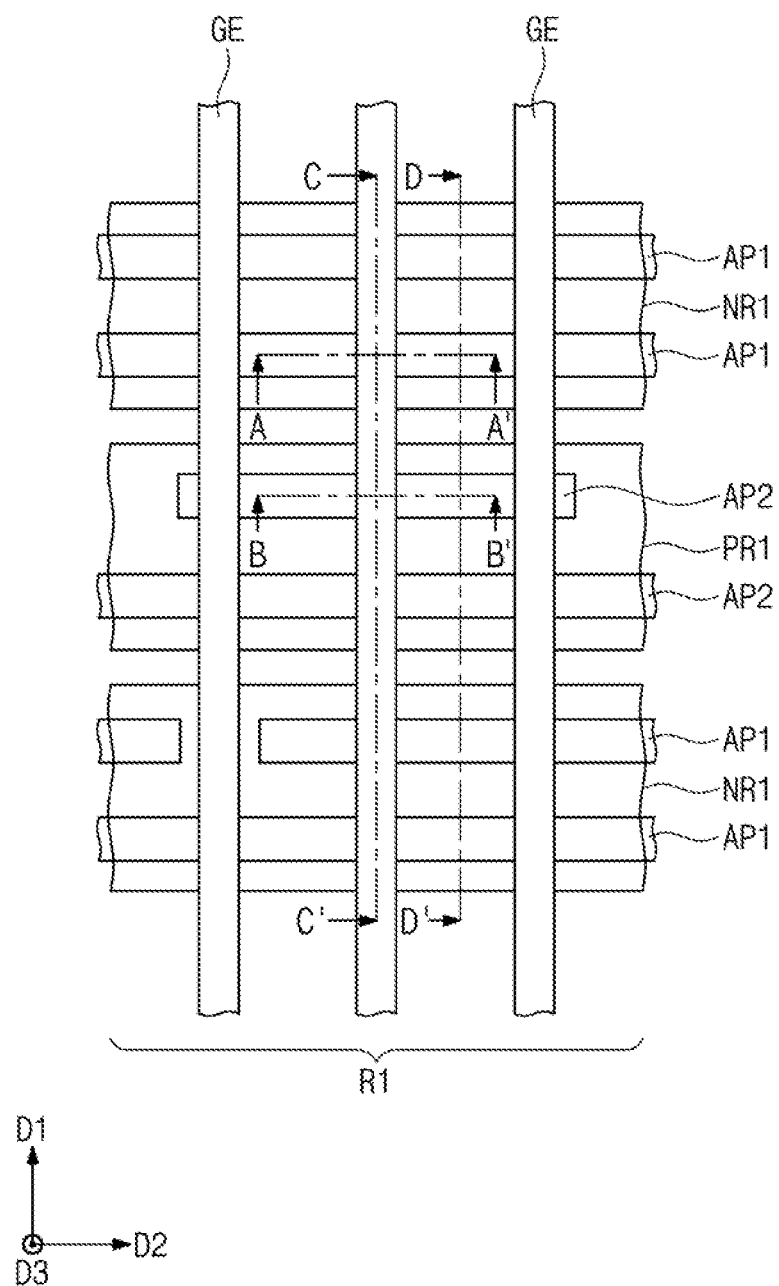
Figure 15A:
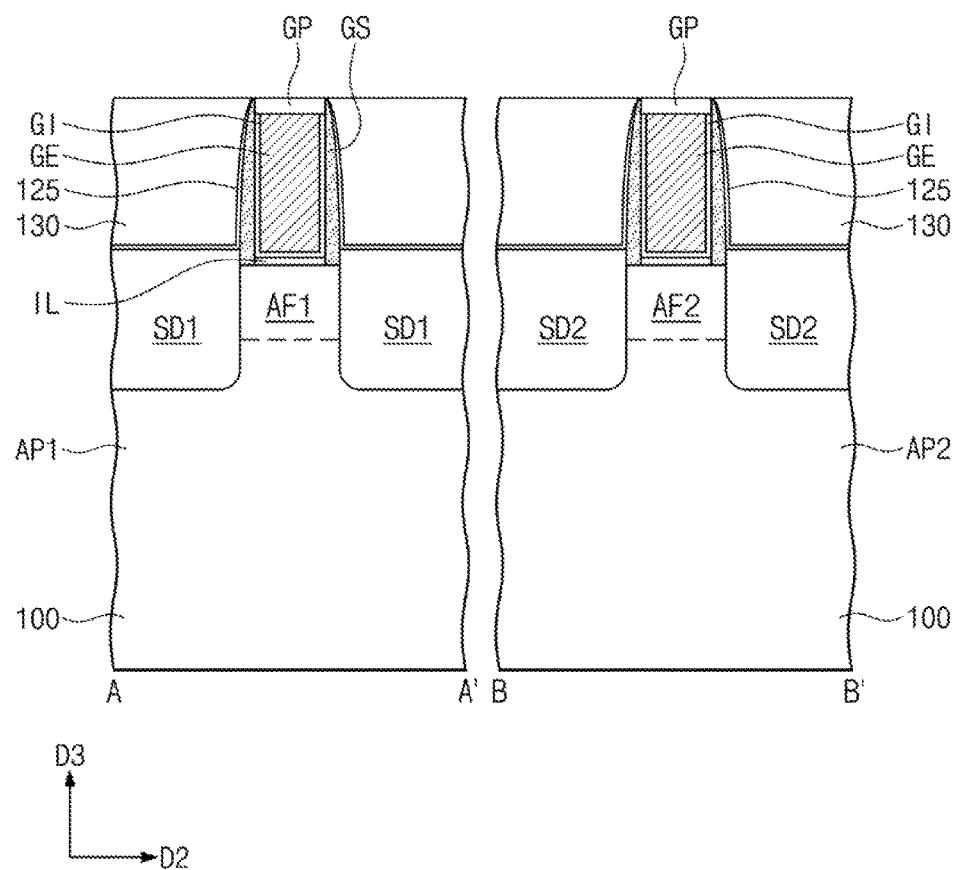
FIG. 15A is a cross-sectional view taken along lines A-A' and B-B' of FIG. 14, and FIGS. 15B and 15C are cross-sectional views taken along lines C-C' and D-D' of FIG. 14, respectively.
Figure 15B:
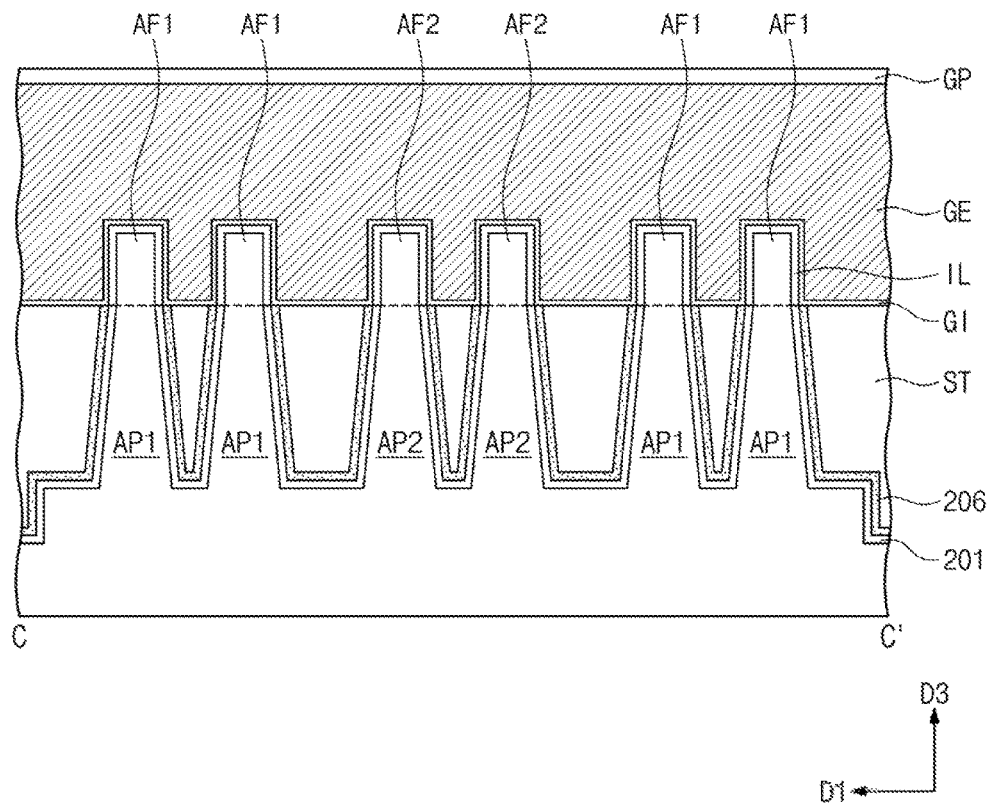
Figure 15C:
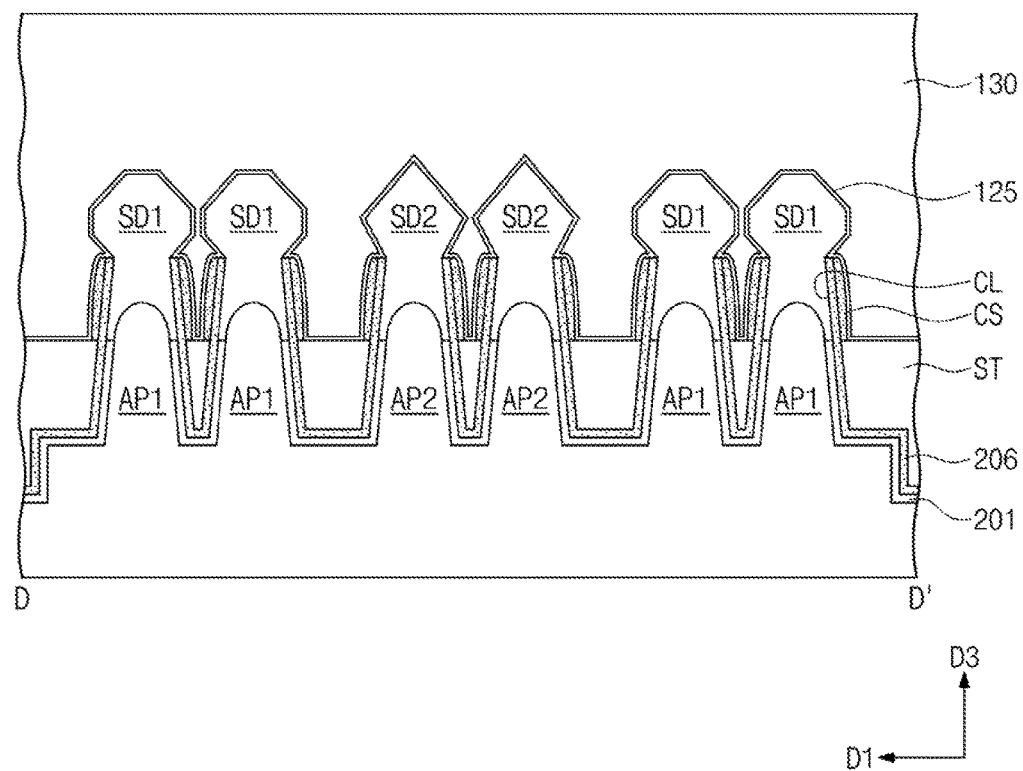

FIGS. 6, 9, and 14 are plan views illustrating a method of manufacturing a semiconductor device, according to some exemplary implementations of the inventive concepts. FIG. 7A is a cross-sectional view taken along lines A-A' and B-B' of FIG. 6, and FIG. 7B is a cross-sectional view taken along a line C-C' of FIG. 6. FIG. 8A is a cross-sectional view taken along the lines A-A' and B-B' of FIG. 6, and FIG. 8B is a cross-sectional view taken along the line C-C' of FIG. 6. FIG. 10A is a cross-sectional view taken along lines A-A' and B-B' of FIG. 9, and FIGS. 10B and 10C are cross-sectional views taken along lines C-C' and D-D' of FIG. 9, respectively. FIG. 11A is a cross-sectional view taken along the lines A-A' and B-B' of FIG. 9, and FIGS. 11B and 11C are cross-sectional views taken along the lines C-C' and D-D' of FIG. 9, respectively. FIG. 12A is a cross-sectional view taken along the lines A-A' and B-B' of FIG. 9, and FIGS. 12B and 12C are cross-sectional views taken along the lines C-C' and D-D' of FIG. 9, respectively. FIG. 13A is a cross-sectional view taken along the lines A-A' and B-B' of FIG. 9, and FIGS. 13B and 13C are cross-sectional views taken along the lines C-C' and D-D' of FIG. 9, respectively. FIG. 15A is a cross-sectional view taken along lines A-A' and B-B' of FIG. 14, and FIGS. 15B and 15C are cross-sectional views taken along lines C-C' and D-D' of FIG. 14, respectively. In the following method of manufacturing a semiconductor device, manufacturing processes performed on the first region R1 will be mainly described. However, the manufacturing processes to be described below may be performed on the first region R1 and the second region R2 at the same time. However, distances between active patterns of the second region R2 may be different from distances between active patterns of the first region R1.

As shown in FIGS. 6, 7A, and 7B, a substrate 100 including a first region R1 may be provided. For example, the substrate 100 may be a silicon substrate, a germanium substrate, or a silicon-on-insulator (SOI) substrate. The first region R1 may correspond to a portion of a memory cell region on which a plurality of memory cells for storing data are formed.

The first region R1 may include a first NMOSFET region NR1 and a first PMOSFET region PR1. In the present embodiment, the first NMOSFET region NR1 may be defined as an active region on which an N-type MOS transistor is disposed, and the first PMOSFET region PR1 may be defined as an active region on which a P-type MOS transistor is disposed. The first NMOSFET region NR1 and the first PMOSFET region PR1 may be alternately arranged in a first direction D1. However, exemplary implementations are not limited thereto.

The substrate 100 may be patterned to form trenches 101 defining first active patterns AP1 and second active patterns AP2. The first and second active patterns AP1 and AP2 may be arranged in the first direction D1 and may have linear shapes extending in a second direction D2 intersecting the first direction D1. The patterning process may include a plurality of etching processes. In some embodiments, one of the plurality of etching processes may be performed after formation of a liner insulating layer to be described later. In this case, the liner insulating layer disposed between the first NMOSFET region NR1 and the first PMOSFET region PR1 may be removed, unlike FIG. 7B.

The first active patterns AP1 may be formed in such a way that a distance between the first active patterns AP1 is a first length L1, and the second active patterns AP2 may be formed in such a way that a distance between the second active patterns AP2 is a second length L2. Meanwhile, a distance between the first and second active patterns AP1 and AP2 adjacent to each other may be a third length L3. Here, the second length L2 may be greater than the first length L1, and the third length L3 may be greater than the second length L2.

A liner insulating layer may be formed on the substrate 100 having the trenches 101. The liner insulating layer may include a first liner insulating layer 201 and a second liner insulating layer 206. The liner insulating layer may be conformally formed on the substrate 100 having the trenches 101. The first liner insulating layer 201 may be in contact with the substrate 100, and the second liner insulating layer 206 may be formed on the first liner insulating layer 201. The second liner insulating layer 206 may be formed of a material having an etch selectivity with respect to the first liner insulating layer 201. For example, the first liner insulating layer 201 may include a silicon oxide layer. For example, the second liner insulating layer 206 may include a silicon nitride layer or a silicon oxynitride layer.

As shown in FIGS. 8A and 8B, device isolation patterns ST may be formed in the trenches 101. The device isolation patterns ST may be formed in such a way that upper portions of the first and second active patterns AP1 and AP2 are exposed. In some embodiments, the process of forming the device isolation patterns ST may include a process of forming an insulating layer on the substrate 100 having the trenches 101 and a process of recessing the insulating layer until the upper portions of the active patterns AP1 and AP2 are exposed. The upper portions of the first and second active patterns AP1 and AP2, which are exposed by the device isolation patterns ST, may be defined as first and second fin patterns AF1 and AF2, respectively. The device isolation patterns ST may be formed of a high-density plasma (HDP) oxide layer, a tetraethylorthosilicate (TEOS) layer, a plasma enhanced tetraethylorthosilicate (PE-TEOS) layer, an O3-tetraethylorthosilicate (O3-TEOS) layer, an undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin on glass (SOG) layer, or any combination thereof.

Capping insulating layers 211 may be formed on the fin patterns AF1 and AF2. In some embodiments, the capping insulating layers 211 may be formed on top surfaces and sidewalls of the fin patterns AF1 and AF2 but may not extend onto the device isolation patterns ST. For example, the capping insulating layer 211 may be a silicon oxide layer formed by a thermal oxidation process. In certain embodiments, the capping insulating layers 211 may extend onto the device isolation patterns ST. In certain embodiments, the process of forming the capping insulating layers 211 may be omitted.

As shown in FIGS. 9, 10A, 10B, and 10C, sacrificial gate patterns 110 and gate mask patterns 115 thereon may be formed on the substrate 100. The sacrificial gate patterns 110 may intersect the first and second active patterns AP1 and AP2 and may extend in the first direction D1. Each of the sacrificial gate patterns 110 may cover top surfaces and sidewalls of the first and second fin patterns AF1 and AF2 and may extend onto top surfaces of the device isolation patterns ST.

Forming the sacrificial gate patterns 110 and the gate mask patterns 115 may include sequentially forming a sacrificial gate layer and a gate mask layer covering the fin patterns AF1 and AF2 on the substrate 100, and sequentially patterning the gate mask layer and the sacrificial gate layer. The sacrificial gate layer may include a poly-silicon layer. The gate mask layer may include a silicon nitride layer or a silicon oxynitride layer. The capping insulating layers 211 may also be etched in the process of patterning the gate mask layer and the sacrificial gate layer. The capping insulating layers 211 and upper portions of the device isolation patterns ST exposed by the sacrificial gate patterns 110 may also be removed during the process of forming the sacrificial gate patterns 110. Thus, top surfaces of the device isolation patterns ST adjacent to source/drain regions to be formed may be lower than top surfaces of the device isolation patterns ST overlapping with the sacrificial gate patterns 110. As a result, the second liner insulating layer 206 may be partially exposed.

A spacer layer 120 may be formed on a resultant structure in which the sacrificial gate patterns 110 are formed. For example, the spacer layer 120 may be formed of at least one of a silicon oxynitride layer or a silicon oxycarbonitride (SiOCN) layer. The spacer layer 120 may be formed by a deposition process such as a chemical vapor deposition (CVD) process or an atomic layer deposition (ALD) process. The spacer layer 120 may cover the first and second fin patterns AF1 and AF2 exposed by the sacrificial gate patterns 110. The spacer layer 120 may extend onto exposed sidewalls of the second liner insulating layer 206.

As shown in FIGS. 11A and 11B, the spacer layer 120 may be anisotropically etched to form first spacers GS on both sidewalls of each of the sacrificial gate patterns 110. In addition, second spacers CS may be formed on the sidewalls of the second liner insulating layer 206 which are exposed by the sacrificial gate patterns 110. Bottom surfaces of the second spacers CS may be in contact with the top surfaces of the device isolation patterns ST.

Portions of the fin patterns AF1 and AF2 exposed by the sacrificial gate patterns 110 may be removed. The portions of the fin patterns AF1 and AF2 may be removed during the process of forming the sacrificial gate patterns 110 and/or the process of forming the second spacers CS. Alternatively, the portions of the fin patterns AF1 and AF2 may be removed by an additional etching process. In some embodiments, removing the portions of the fin patterns AF1 and AF2 may include forming a mask pattern on the substrate 100 and performing an etching process using the mask pattern as an etch mask. The etching process may include a dry etching process and/or a wet etching process.

In some exemplary implementations, top surfaces of the active patterns AP1 and AP2 may be disposed at the substantially same level as top surfaces of the first and second liner insulating layers 201 and 206 due to the removal of the portions of the fin patterns AF1 and AF2, as illustrated in FIG. 11C. Alternatively, the top surfaces of the active patterns AP1 and AP2 may be disposed at a higher or lower level than the top surfaces of the first and second liner insulating layers 201 and 206 due to the removal of the portions of the fin patterns AF1 and AF2.

As shown in FIGS. 12A and 12B, upper portions of the active patterns AP1 and AP2 exposed by the sacrificial gate patterns 110 may be selectively removed by an etching process. In addition, upper portions of the first liner insulating layer 201 exposed by the sacrificial gate patterns 110 may be removed. The removal of the upper portions of the first liner insulating layer 201 may be performed after the removal of the upper portions of the active patterns AP1 and AP2. However, exemplary implementations are not limited thereto. After the etching process for the removal of the upper portions of the active patterns AP1 and AP2, the active patterns AP1 and AP2 exposed by the sacrificial gate patterns 110 may have rounded top surfaces having curvatures convex in a direction away from the substrate 100. However, exemplary implementations are not limited to the shapes of the active patterns AP1 and AP2 illustrated in FIG. 12C. In certain exemplary implementations, the shapes of the active patterns AP1 and AP2 may be variously modified according to a characteristic of the etching process. The top surfaces of the active patterns AP1 and AP2 may be higher than the top surfaces of the device isolation patterns ST.

The etching process of the first liner insulating layer 201 and the etching process of the active patterns AP1 and AP2 may be performed using a dry etching process and/or a wet etching process. The etching process of the first liner insulating layer 201 and the etching process of the active patterns AP1 and AP2 may be performed using a process recipe capable of minimizing etching of the second liner insulating layer 206 and the second spacers CS. Thus, portions of the second liner insulating layer 206 and at least portions of the second spacers CS, which protrude from the top surfaces of the device isolation patterns ST, may remain after the etching process. As a result, recess regions CS may be defined by the top surfaces of the active patterns AP1 and AP2 and the protruding portions of the second liner insulating layer 206. In some embodiments, an etched depth of the first active pattern AP1 may be substantially equal to that of the second active pattern AP2, and thus the top surface of the first active pattern AP1 may be disposed at the substantially same level as the top surface of the second active pattern AP2, as illustrated in FIG. 12C. Alternatively, the etched depth of the first active pattern AP1 may be different from that of the second active pattern AP2. For example, the etched depth of the second active pattern AP2 may be greater than that of the first active pattern AP1. This may be caused by a difference between a pattern density of the first active patterns AP1 and a pattern density of the second active patterns AP2 (i.e., a difference between the distance between the first active patterns AP1 and the distance between the second active patterns AP2).

As shown in FIGS. 13A and 13C, first and second source/drain regions SD1 and SD2 may be formed at both sides of each of the sacrificial gate patterns 110. The first source/drain regions SD1 may be formed on the top surfaces of the first active patterns AP1, respectively, and the second source/drain regions SD2 may be formed on the top surfaces of the second active patterns AP2, respectively. In other words, the first source/drain regions SD1 may be formed by an epitaxial growth process using the first active patterns AP1 as seeds. The second source/drain regions SD2 may be formed by an epitaxial growth process using the second active patterns AP2 as seeds.

Lower portions of the source/drain regions SD1 and SD2 may be formed inside the recess regions CL, and upper portions of the source/drain regions SD1 and SD2 may be formed outside the recess regions CL. In other words, the second liner insulating layer 206 may limit lateral growth (or horizontal growth) of the lower portions of the source/drain regions SD1 and SD2 during the growth of the lower portions of the source/drain regions SD1 and SD2. On the contrary, since the second liner insulating layer 206 does not spatially limit the growth of the upper portions of the source/drain regions SD1 and SD2, the upper portions of the source/drain regions SD1 and SD2 may be grown in a vertical direction and a lateral direction at the same time. In other words, the lateral growth may be limited in the early stage of the growth of the source/drain regions SD1 and SD2 but may not be limited in the later stage of the growth of the source/drain regions SD1 and SD2. Thus, the source/drain regions SD1 and SD2 may have required volumes and it is possible to solve an undesired contact problem between source/drain regions.

The amounts of the lower portions of the source/drain regions SD1 and SD2 formed in the recess regions CL may be changed by adjusting etch amounts of the first liner insulating layer 201 and the active patterns AP1 and AP2. In other words, the amounts of the lower portions of the source/drain regions SD1 and SD2 formed in the recess regions CL may be adjusted in consideration of a source/drain resistance and a distance between active patterns, which are required in a corresponding transistor.

The first source/drain regions SD1 may be formed to induce a tensile strain in the first fin patterns AF1 disposed therebetween. For example, when the substrate 100 is a silicon substrate, the first source/drain regions SD1 may be formed of silicon (Si) or silicon carbide (SiC). The first source/drain regions SD1 may be doped with N-type dopants during or after the epitaxial growth process.

Meanwhile, the second source/drain regions SD2 may be formed to induce a compressive strain in the second fin patterns AF2 disposed therebetween. For example, when the substrate 100 is a silicon substrate, the second source/drain regions SD2 may be formed of silicon-germanium (SiGe). The second source/drain regions SD2 may be doped with P-type dopants during or after the epitaxial growth process.

Since the first and second source/drain regions SD1 and SD2 are grown using materials different from each other, shapes and sizes of the first and second source/drain regions SD1 and SD2 may be different from each other. For example, the maximum width in the first direction D1 of the first source/drain region SD1 may be different from the maximum width in the first direction D1 of the second source/drain region SD2. In addition, the second source/drain regions SD2 may be more uniformly grown than the first source/drain regions SD1. Thus, the second source/drain regions SD2 may have tapered upper portions when viewed from a cross-sectional view taken along the first direction D1. On the contrary, the first source/drain regions SD1 may have relatively flat top surfaces.

The second source/drain regions SD2 may be spaced apart from each other in the first direction D1. On the contrary, the second source/drain regions SD2 on the second region R2 described with reference to FIGS. 4 and 5 may be merged with each other during an epitaxial growth process thereof. Thus, a source/drain region in one body may be formed to extend in the first direction D1.

As shown in FIGS. 14 and 15A to 15C, an etch stop layer 125 may be conformally formed. The etch stop layer 125 may be formed to cover the device isolation patterns ST, the first and second source/drain regions SD1 and SD2, and the first spacers GS. The etch stop layer 125 may be formed of a material having an etch selectivity with respect to a first interlayer insulating layer 130 to be described later. For example, the etch stop layer 125 may include a silicon nitride layer or a silicon oxynitride layer. The etch stop layer 125 may be formed by a CVD process or an ALD process.

A first interlayer insulating layer 130 may be formed on the substrate 100 having the etch stop layer 125. For example, the first interlayer insulating layer 130 may be formed of a silicon oxide layer. Next, the first interlayer insulating layer 130 may be planarized until the top surfaces of the sacrificial gate patterns 110 are exposed. The planarization process may include an etch-back process and/or a chemical mechanical polishing (CMP) process. When the first interlayer insulating layer 130 is planarized, portions of the etch stop layer 125 and the gate mask patterns 115 on the sacrificial gate patterns 110 may also be removed.

The exposed sacrificial gate patterns 110 may be removed to form gap regions, each of which exposes the first and second fin patterns AF1 and AF2 corresponding to first and second channel regions between the first spacers GS. The gap regions may be formed by performing an etching process selectively removing the sacrificial gate patterns 110. The capping insulating layers 211 may be removed simultaneously with the sacrificial gate patterns 110 or may be removed separately from the sacrificial gate patterns 110.

An oxidation process using plasma may be performed on the first and second fin patterns AF1 and AF2 exposed through the gap regions, thereby growing interface layers IL from the first and second fin patterns AF1 and AF2. In other words, the interface layers IL may be a product obtained by thermal oxidation and/or chemical oxidation of the first and second fin patterns AF1 and AF2. The oxidation process may use plasma of at least one of oxygen ($O_2$), ozone ($O_3$), or water vapor ($H_2O$). For example, each of the interface layers IL may include a silicon oxide layer.

Next, a gate insulating pattern GI and a gate electrode GE may be formed to sequentially fill each of the gap regions. In some embodiments, a gate insulating layer may be formed to partially fill the gap regions. The gate insulating layer may cover top surfaces and sidewalls of the first and second fin patterns AF1 and AF2. For example, the gate insulating layer may be formed of at least one of a silicon oxide layer, a silicon oxynitride layer, or a high-k dielectric layer having a dielectric constant higher than that of a silicon oxide layer. A gate conductive layer may be formed on the gate insulating layer to completely fill the rest of the gap regions. For example, the gate conductive layer may be formed of at least one of a doped semiconductor material, a conductive metal nitride, or a metal. The gate conductive layer and the gate insulating layer may be sequentially planarized to form the gate insulating pattern GI and the gate electrode GE in each of the gap regions.

Thereafter, the gate insulating patterns GI and the gate electrodes GE may be recessed, and capping patterns GP may be formed on the recessed gate electrodes GE, respectively. For example, the capping pattern GP may be formed of at least one of silicon oxide, silicon nitride, or silicon oxynitride.

As shown in FIGS. 1 and 2A to 2C, a second interlayer insulating layer 150 may be formed on the first interlayer insulating layer 130. For example, the second interlayer insulating layer 150 may be formed of a silicon oxide layer. Subsequently, source/drain contacts CA may be formed at both sides of each of the gate electrodes GE. In detail, the contact holes may be formed to penetrate the second interlayer insulating layer 150, the first interlayer insulating layer 130, and the etch stop layer 125. The contact holes may expose the first and second source/drain regions SD1 and SD2. When the contact holes are formed, upper portions of the first and second source/drain regions SD1 and SD2 may be partially etched. Next, a first conductive pattern 160 and a second conductive pattern 165 may be formed to sequentially fill each of the contact holes. The first conductive pattern 160 may be a barrier conductive pattern and may be formed of at least one of, but not limited to, titanium nitride, tungsten nitride, or tantalum nitride. The second conductive pattern 165 may be a metal pattern and may be formed of at least one of, but not limited to, tungsten, titanium, or tantalum.

Even though not shown in the drawings, interconnections may be formed on the second interlayer insulating layer 150 so as to be connected to the source/drain contacts CA, respectively. The interconnections may include a conductive material.

According to exemplary implementations, the volumes of the source/drain regions may be maintained and a contact between the source/drain regions may be prevented.

While the inventive concepts have been described with reference to exemplary implementations, it will be apparent to those skilled in the art that various changes and modifications may be made without departing from the spirits and scopes of the inventive concepts. Therefore, it should be understood that the above exemplary implementations are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   an active pattern having sidewalls defined by a device isolation pattern on a substrate, the active pattern having an upper portion protruding from a top surface of the device isolation pattern;
   a liner insulating layer on the sidewalls of the active pattern;
   a gate structure on the active pattern; and
   source/drain regions at both sides of the gate structure,
   wherein the liner insulating layer comprises:
      a first liner insulating layer extending between the active pattern and the device isolation pattern; and
      a second liner insulating layer having a first portion between the first liner insulating layer and the device isolation pattern, and a second portion protruding above the top surface of the device isolation pattern and having a top surface higher than a top surface of the first liner insulating layer, and
   wherein each of the source/drain regions comprises:
      a first portion defined by the second liner insulating layer; and
      a second portion protruding upward above the second liner insulating layer and formed above a topmost surface of the first liner insulating layer.

2. The semiconductor device of claim 1, wherein the first portion of each of the source/drain regions is in contact with a sidewall of the second portion of the second liner insulating layer.

3. The semiconductor device of claim 1, wherein a top surface of the first liner insulating layer overlapping with the gate structure is at a substantially same level as a top surface of the second liner insulating layer overlapping with the gate structure.

4. The semiconductor device of claim 1, further comprising:
   a first spacer provided on the second liner insulating layer, the first spacer being in contact with the top surface of the device isolation pattern.

5. The semiconductor device of claim 4, wherein the gate structure comprises:
a gate electrode; and
a second spacer provided on a sidewall of the gate electrode, and
wherein the first spacer is formed of the same material as the second spacer.

6. The semiconductor device of claim 1, wherein the active pattern comprises: a first portion overlapping with the gate structure; and second portions overlapping with the source/drain regions,
wherein top surfaces of the second portions of the active pattern are lower than a top surface of the first portion of the active pattern,
wherein the second portions of the active pattern are inserted in the first portions of the source/drain regions, respectively, and
wherein an upper portion of each of the second portions of the active pattern has a rounded surface.

7. The semiconductor device of claim 6, wherein the first portions of the source/drain regions extend onto sidewalls of the second portions of the active pattern.

8. The semiconductor device of claim 1, wherein a topmost surface of the first liner insulating layer is at a substantially same level as or a lower level than the top surface of the device isolation pattern.

9. The semiconductor device of claim 1, wherein the gate structure extends in one direction, and
wherein, for each of the source/drain regions, a width in the one direction of the first portion of the source/drain region is smaller than a width in the one direction of the second portion of the source/drain region.

10. A semiconductor device comprising:
an active pattern having sidewalls defined by a device isolation pattern on a substrate, the active pattern having an upper portion protruding from a top surface of the device isolation pattern;
a liner insulating layer extending between the active pattern and the device isolation pattern;
spacers provided on sidewalls of the liner insulating layer;
a gate structure on the active pattern; and
source/drain regions at both sides of the gate structure,
wherein the liner insulating layer comprises:
a first liner insulating layer extending between the active pattern and the device isolation pattern, and
a second liner insulating layer having a first portion between the first liner insulating layer and the device isolation pattern, and a second portion between the source/drain regions and the spacers, the second portion protruding above the top surface of the device isolation pattern to define a lower portion of each of the source/drain regions.

11. The semiconductor device of claim 10,
wherein each of the source/drain regions comprises: a first portion defined by the second liner insulating layer; and a second portion protruding upward from the second liner insulating layer.

12. The semiconductor device of claim 11, wherein bottom surfaces of the source/drain regions are in contact with a top surface of the first liner insulating layer.

13. The semiconductor device of claim 11, wherein a top surface of the first liner insulating layer is disposed at a substantially same level as or a lower level than the top surface of the device isolation pattern.

14. The semiconductor device of claim 11,
wherein the spacers are spaced apart from the source/drain regions with the second liner insulating layer interposed therebetween, and
wherein the first liner insulating layer is formed of a material having an etch selectivity with respect to both the second liner insulating layer and the spacers.

15. The semiconductor device of claim 11, wherein a portion of an upper portion of the active pattern is inserted in the lower portion of the each of the source/drain regions.

16. The semiconductor device of claim 10, wherein the substrate includes an NMOSFET region and a PMOSFET region,
wherein the active pattern includes a first active pattern on the NMOSFET region and a second active pattern on the PMOSFET region, and
wherein the source/drain regions include first source/drain region on the first active pattern and second source/drain region on the second active pattern.

17. The semiconductor device of claim 16, wherein the first source/drain region includes a material of which a lattice constant is substantially equal to or smaller than that of the substrate, and
wherein the second source/drain region includes a material of which a lattice constant is greater than that of the substrate.

18. A semiconductor device comprising:
an active pattern protruding from a substrate;
a gate structure intersecting the active pattern; and
source/drain regions at both sides of the gate structure,
wherein the active pattern comprises: a first portion overlapping with the gate structure; and second portions overlapping with the source/drain regions,
wherein top surfaces of the second portions of the active pattern are lower than a top surface of the first portion of the active pattern, and
wherein upper portions of the second portions of the active pattern are inserted into lower portions of the source/drain regions, respectively.

19. The semiconductor device of claim 18, wherein the second portions of the active pattern have rounded top surfaces having curvatures convex in a direction away from the substrate.

* * * * *